(12) United States Patent
Kim

(10) Patent No.: US 10,964,264 B1
(45) Date of Patent: Mar. 30, 2021

(54) ELECTROLUMINESCENT DISPLAY PANEL HAVING PIXEL DRIVING CIRCUIT

(71) Applicant: LG Display Co., Ltd., Seoul (KR)

(72) Inventor: Jung Chul Kim, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 15/930,344

(22) Filed: May 12, 2020

(30) Foreign Application Priority Data

Nov. 12, 2019 (KR) .................. 10-2019-0144624

(51) Int. Cl.
G09G 3/325 (2016.01)
G09G 3/3266 (2016.01)
G09G 3/3291 (2016.01)
H01L 27/32 (2006.01)

(52) U.S. Cl.
CPC .......... G09G 3/325 (2013.01); G09G 3/3266 (2013.01); G09G 3/3291 (2013.01); H01L 27/3276 (2013.01); G09G 2310/0278 (2013.01)

(58) Field of Classification Search
CPC .. G09G 3/325; G09G 3/3266; H01L 27/3276; G09F 2310/0278
See application file for complete search history.

(56) References Cited

U.S. PATENT DOCUMENTS

| 2014/0184665 A1* | 7/2014 | Yoon | G09G 3/3233 345/691 |
| 2017/0154572 A1* | 6/2017 | Kim | G09G 3/3233 |

\* cited by examiner

*Primary Examiner* — Stacy Khoo
(74) *Attorney, Agent, or Firm* — Polsinelli PC

(57) ABSTRACT

An electroluminescent display panel including a pixel driving circuit that includes a light-emitting element, a first capacitor connected to a first node and a second node, a second capacitor connected to the second node and a high potential voltage line, a driving transistor supplying electric current to the light-emitting element, a first switching circuit controlled by a first scan signal and turned on during the sampling period to compensate for a time-varying characteristic of the driving transistor, a second switching circuit controlled by a second scan signal and turned on during the programming period to apply a data voltage to the second node, and a light emission control circuit controlled by an emission signal and turned on during the initialization period and the emission period to apply the high potential voltage to the driving transistor.

20 Claims, 24 Drawing Sheets

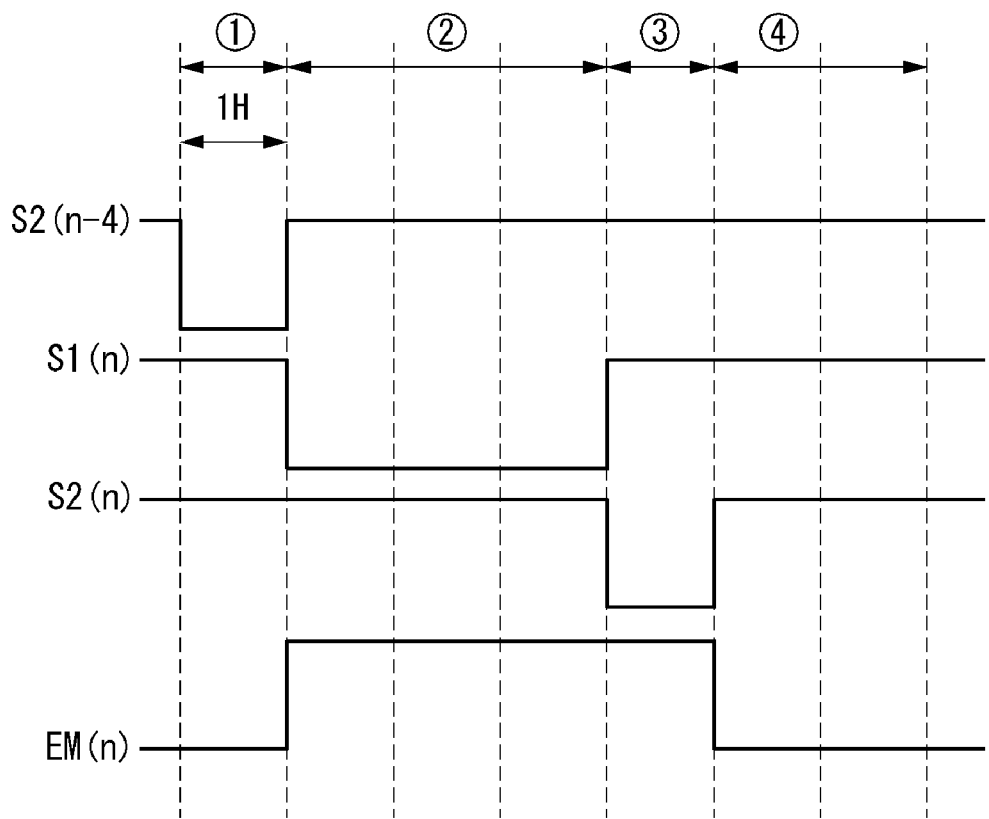

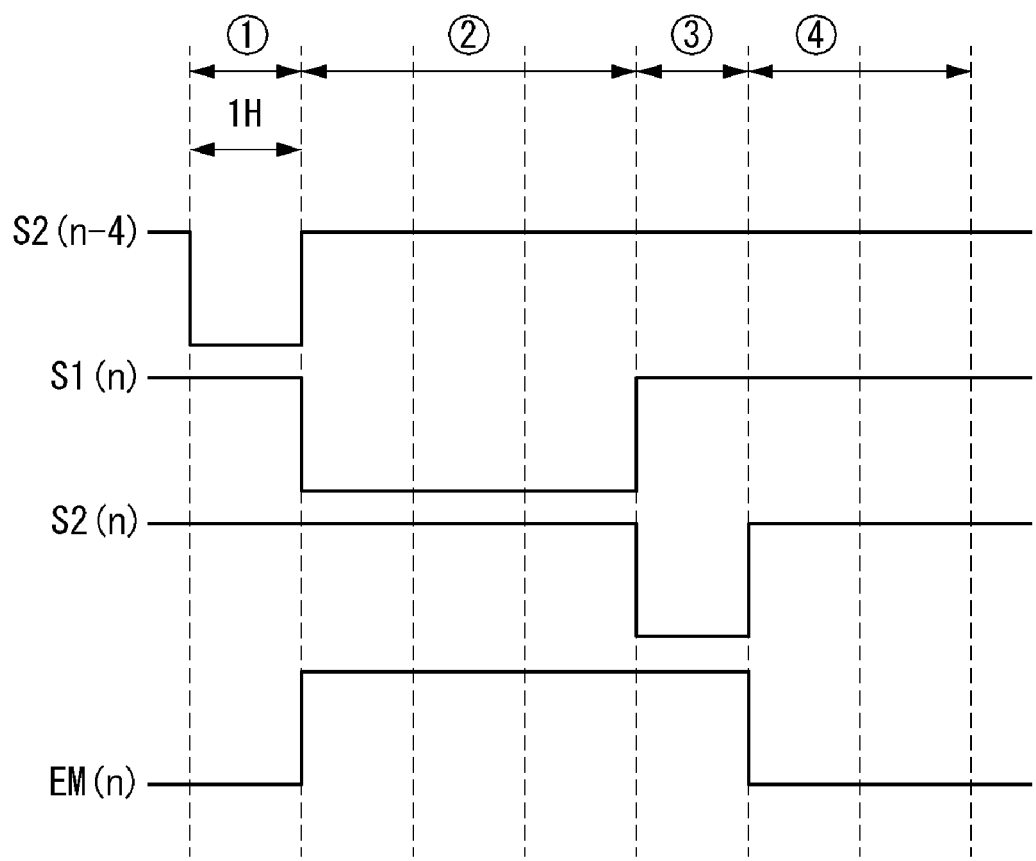

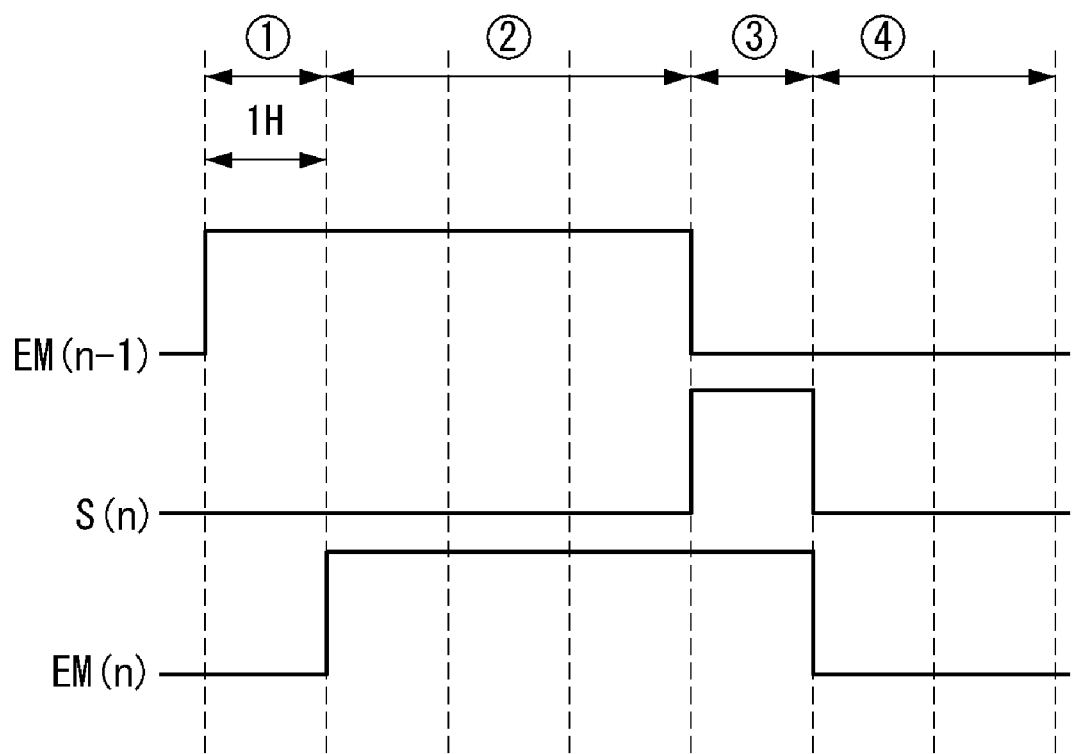

ELECTROLUMINESCENT DISPLAY PANEL HAVING PIXEL DRIVING CIRCUIT

CROSS REFERENCE TO RELATED APPLICATION

This application claims priority to and the benefit of Korean Patent Application No. 10-2019-0144624, filed on Nov. 12, 2019, which is hereby incorporated by reference in its entirety.

BACKGROUND

Field of the Disclosure

The present disclosure relates to an electroluminescent display panel including a pixel driving circuit, and more particularly, to an electroluminescent display panel capable of high-resolution and high-frequency driving.

Description of the Background

With the development of information technology, the market for display devices, which are connection media between information and users, is growing. Beyond text-based information transfer, various types of communication are actively performed between users. As the type of information changes, the performance of a display device for displaying information is also developing. Accordingly, the use of various types of display devices such as an electroluminescent display, a liquid crystal display, and a quantum dot display is increasing, and display devices capable of high-resolution and high-frequency driving have been actively studied in order to increase information clarity.

A display device includes a display panel including a plurality of subpixels, a driving circuit for supplying one or more signals for driving the display panel, a power supply unit for supplying power to the display panel, and the like. The driving circuit includes a gate driving circuit for supplying a gate signal to the display panel, a data driving circuit for supplying a data signal to the display panel, and the like.

For example, an electroluminescent display panel may display an image by a light-emitting element of a selected subpixel that emits light when a gate signal, a data signal, and the like are supplied to subpixels. The light-emitting element may be implemented based on an organic material or an inorganic material.

An electroluminescent display panel has various advantages because it displays an image based on light generated from a light-emitting element in a subpixel but requires improvement in the accuracy of the pixel driving circuit which controls light emission of subpixels. For example, by compensating for a time-varying characteristic (or a change with time) in which a threshold voltage of a transistor included in a pixel driving circuit changes, it is possible to improve the accuracy of the pixel driving circuit and to thereby finally improve the quality of the display device.

Sufficient compensation time should be provided to compensate for the time-varying characteristic of the electroluminescent display panel. However, an increase in resolution and/or frequency of a display panel shortens the compensation time, resulting in poor image quality such as stains, afterimages, and cross-talk on a screen.

SUMMARY

The present disclosure is made in view of the above-mentioned problems and provides a pixel driving circuit which allows sufficient compensation time to be secured in high-resolution and high-frequency driving.

The present disclosure provides an electroluminescent display panel including a pixel driving circuit having improved response speed through high-speed driving and improved image quality through removal of spots, afterimages, and crosstalk from a screen by securing sufficient compensation time for compensating for a time-varying characteristic of a display panel.

The present disclosure provides an electroluminescent display panel including a pixel driving circuit having reduced bezel BZ by at least one of improving the degree of integration of the pixel driving circuit composed of a plurality of transistors, diversifying the types of the transistors, and simplifying circuits included in a gate driving circuit.

The present disclosure is not limited to the above-described objectives, and other objectives that are not described herein will be apparently understood by those skilled in the art from the following description.

There is provided an electroluminescent display panel according to an aspect of the present disclosure in which each of a plurality of subpixels included in an nth row (here, n is a natural number) includes a pixel driving circuit that is driven according to or in an initialization period, a sampling period, a programming period, and an emission period, wherein the pixel driving circuit includes a light-emitting element, a first capacitor connected to a first node and a second node, a second capacitor connected to the second node and a high potential voltage line which provides a high potential voltage, a driving transistor configured to supply electric current to the light-emitting element and controlled by a voltage applied to the first node, a first switching circuit controlled by a first scan signal and turned on during the sampling period to compensate for a time-varying characteristic of the driving transistor, a second switching circuit controlled by a second scan signal and turned on during the programming period to apply a data voltage to the second node, and a light emission control circuit controlled by an emission signal and turned on during the initialization period and the emission period to apply the high potential voltage to the driving transistor. In this case, the sampling period is longer as one horizontal period or has a period exceeding one horizontal period, and the initialization period and the programming period are equal to one horizontal period. Thus, a sampling period can be provided for a high-resolution/high-frequency display panel which is sufficiently long, since usually in common high-resolution/high-frequency display panels the horizontal period is decreased. However, according to the present disclosure the sampling period may be sufficiently secured, and thus it is possible to improve an image quality of the display panel by enhancing compensation capability of a pixel driving circuit.

There is provided an electroluminescent display panel according to an aspect of the present disclosure in which each of a plurality of subpixels included in an nth row (here, n is a natural number) includes a pixel driving circuit that is driven according to an initialization period, a sampling period, a programming period, and a emission period, wherein the pixel driving circuit includes a light-emitting element, a first capacitor connected to a first node and a second node, a second capacitor connected to the second node and a high potential voltage line, a driving transistor configured to supply electric current to the light-emitting element and controlled by a voltage applied to the first node, a first switching circuit controlled by a first emission signal and turned on during the sampling period to compensate for a time-varying characteristic of the driving transistor, a second switching circuit controlled by a scan signal and turned on during the programming period to apply a data voltage to the second node, and a light emission control circuit controlled by a second emission signal and turned on during the initialization period and the emission period to apply the high potential voltage to the driving transistor. In this case, the sampling period is a period exceeding one horizontal period, and the initialization period and the programming period are equal to one horizontal period. Thus, a sampling period of a high-resolution/high-frequency display panel in which one horizontal period is decreased may be sufficiently secured, and thus it is possible to improve an image quality issue of the display panel by enhancing compensation capability of a pixel driving circuit.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspect(s) of the disclosure and along with the description serve to explain the principle of the disclosure.

In the drawings:

FIGS. 6A and 6B show a pixel driving circuit and a gate signal waveform according to an aspect of the present disclosure;

FIGS. 9A and 9B show a pixel driving circuit and a gate signal waveform according to an aspect of the present disclosure;

FIGS. 10A and 10B show a pixel driving circuit and a gate signal waveform according to an aspect of the present disclosure;

DETAILED DESCRIPTION

Figure 1:
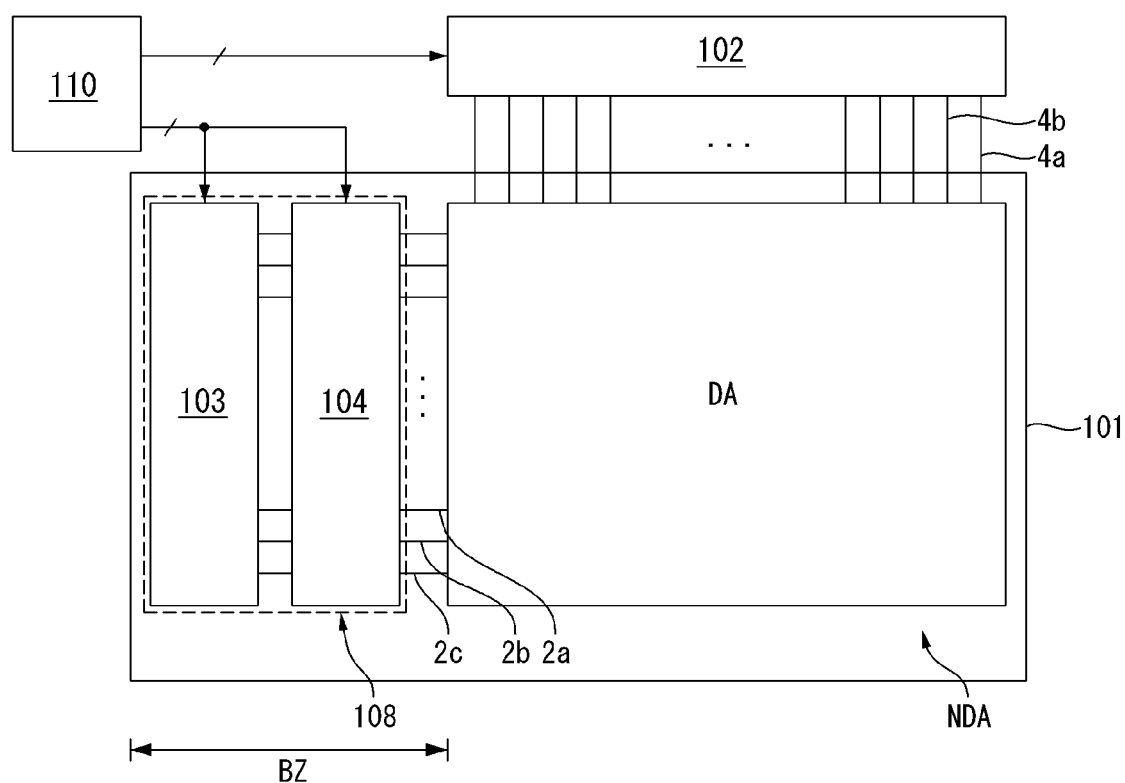
FIG. 1 is a block diagram showing an electroluminescent display device according to an aspect of the present disclosure.

Advantages and features of the present disclosure, and implementation methods thereof will be clarified through the following aspects described with reference to the accompanying drawings. However, the present disclosure is not limited to aspects disclosed herein and may be implemented in various different forms. The aspects are provided for making the disclosure of the present disclosure thorough and for fully conveying the scope of the present disclosure to those skilled in the art. It is to be noted that the scope of the present disclosure is defined by the claims.

The figures, dimensions, ratios, angles, numbers, and the like disclosed in the drawings for describing the aspects of the present disclosure are merely illustrative and are not limited to matters shown in the present disclosure. Like reference numerals refer to like elements throughout. Further, in describing the present disclosure, detailed descriptions of well-known technologies will be omitted when it is determined that they may unnecessarily obscure the gist of the present disclosure. Terms such as "including" and "having" used herein are intended to allow other elements to be added unless the terms are used with the term "only." Any references to singular may include plural unless expressly stated otherwise.

Components are interpreted to include an ordinary error range even if not expressly stated.

For description of a positional relationship, for example, when the positional relationship between two parts is described as "on," "above," "below," "next to," and the like, one or more parts may be interposed therebetween unless the term "immediately" or "directly" is used in the expression.

For description of a temporal relationship, for example, when a temporal relationship is described as "after," "subsequently to," "next," "before," and the like, a non-consecutive case may be included unless the term "immediately" or "directly" is used in the expression.

The features of various aspects of the present disclosure may be partially or entirely bonded to or combined with each other. The aspects may be interoperated and performed in technically various ways and may be carried out independently of or in association with each other.

In the present disclosure, a driving circuit and a gate driving circuit formed on a substrate of a display panel may be implemented as an N-type or P-type transistor. For example, the transistor may be implemented as a transistor having a metal-oxide-semiconductor field-effect transistor (MOSFET) structure. The transistor is a three-electrode element including a gate, a source, and a drain. The source is an electrode for supplying carriers to the transistor. In the transistor, the carriers move from the source to the drain. In the case of an N-type transistor, the carriers are electrons. Thus, the electrons move from the source to the drain, and the source voltage is lower than the drain voltage. In the N-type transistor, the direction of the current is from the drain to the source because the electrons move from the source to the drain. In the case of a P-type transistor, the carriers are holes. Thus, the source voltage is higher than the drain voltage so that the holes may move from the source to the drain. In the P-type transistor, the direction of the current is from the source to the drain because the holes move from the source to the drain. The source and drain of the transistor are not fixed, and the source and drain of the transistor may be changed depending on an applied voltage.

Here, a gate-on voltage may be a voltage of a gate signal which may turn the transistor on. A gate-off voltage may be a voltage which may turn the transistor off. In the case of a P-type transistor, the turn-on voltage may be a gate low voltage, and the turn-off voltage may be a gate high voltage.

In the case of an N-type transistor, the gate-on voltage may be a gate high voltage, and the gate-off voltage may be a gate low voltage.

A driving circuit and an electroluminescent display device including the same according to an aspect of the present disclosure will be described below with reference to the accompanying drawings.

FIG. 1 is a block diagram showing an electroluminescent display device according to an aspect of the present disclosure.

Referring to FIG. 1, an electroluminescent display device 100 includes a display panel 101, a data driving circuit 102 which provides a signal to the display panel 101, a gate driving circuit 108, and a timing controller 110.

The display panel 101 may be divided into a display area DA where images are displayed and a non-display area NDA where no image is displayed. In the display area DA, pixels for displaying an image are arranged. Each of the pixels may include a plurality of subpixels for implementing individual colors. The subpixels may be divided into red subpixels, green subpixels, and blue subpixels to implement the colors. Also, one or more of the pixels may further include white subpixels.

Each of the subpixels is connected to a data line arranged along a column line (or in a column direction) and is connected to a gate line arranged along a row line (or in a row direction). Subpixels disposed along the same row line share the same gate line and are driven at the same time. Also, when subpixels connected to a first gate line are defined as first subpixels and subpixels connected to an nth gate line are defined as nth subpixels, the first to nth subpixels are sequentially driven.

Each of the subpixels includes a pixel driving circuit for emitting light of a light-emitting element EL, and the pixel driving circuit operates by receiving at least a data signal, a gate signal, and a power signal. The data signal is provided from a data driving circuit 102 to subpixels through a data line 4a, the gate signal is provided from a gate driving circuit 108 to subpixels through gate lines 2a, 2b, and 2c, and the power signal is provided to subpixels through a power line 4b. The power line 4b may include a high-potential voltage line for supplying a high potential voltage to subpixels, a low-potential voltage electrode for supplying a low potential voltage to subpixels, and an initialization voltage line for supplying an initialization voltage to subpixels. The high-potential voltage is higher than the low-potential voltage and the initialization voltage, and the initialization voltage is lower than or equal to the low-potential voltage. The gate lines 2a, 2b, and 2c may include multiple scan lines 2a and 2b through which a scan signal is supplied and multiple emission signal lines 2c through which a light emission control signal is supplied.

The data driving circuit 102 generates a data voltage by converting data of an input image received from the timing controller 110 into a gamma compensation voltage under the control of the timing controller 110 and outputs the generated data voltage to data lines 4a. The data driving circuit 102 may be formed on the display panel 101 in the form of an integrated circuit (IC) or may be formed on the display panel 101 in the form of a chip-on-film (COF).

The gate driving circuit 108 includes a scan driving circuit 103 and an emission driving circuit 104. The scan driving circuit 103 sequentially supplies scan signals to the scan lines 2a and 2b under the control of the timing controller 110. For example, an nth scan signal applied to the nth gate line (here, n is a natural number) is synchronized with an nth data voltage. The emission driving circuit 104 generates an emission signal under the control of the timing controller 110. The emission driving circuit 104 sequentially supplies emission signals to emission lines 2c.

The gate driving circuit 108 may be formed as an IC or may be formed as a gate in panel (GIP) embedded in the display panel 101. The gate driving circuit 108 may be disposed on either or both of the left and right sides of the display panel 101. The gate driving circuit 108 may be provided in the non-display area NDA.

The timing controller 110 receives digital video data of the input image and a timing signal synchronized with the digital video data from a host system. The timing signal may include a data enable signal, a vertical synchronization signal, a horizontal synchronization signal, and a clock signal. The host system may be a television (TV) system, a set-top box, a navigation system, a digital video disc (DVD) player, a Blu-ray player, a personal computer, a home theater system, or a mobile information device.

The timing controller 110 generates a data timing control signal for controlling operation timing of the data driving circuit 102, a gate timing control signal for controlling operation timing of the gate driving circuit 108, etc. on the basis of the timing signal received from the host system. The gate timing control signal includes a start pulse, a shift clock, etc. The start pulse may define start timing at which a first output is generated for each shift register of the scan driving circuit 103 and the emission driving circuit 104. The shift register starts to be driven when the start pulse is input and generates a first output signal at the first clock timing. The shift clock controls the output shift timing of the shift register.

A period in which the subpixels present in the display area DA and arranged in the column direction are all driven may be referred to as a first frame period. The first frame period may be divided into a scan period in which data of the input image is addressed from gate lines connected to subpixels to the subpixels and then written in the subpixels and a emission period in which the subpixels repeatedly turn on and off according to an emission signal after the scan period. The scan period may be divided into a period for initializing driving circuits, a sampling period, and a programming period. The initialization of the driving circuits, the compensation for the threshold voltage of the driving transistor, and the charging of the data voltage are performed during the scan period, and the light emission operation is performed during the emission period. Since the scan period includes only several horizontal periods, most of one frame period is an emission period.

As the resolution of the display panel 101 increases, the number of subpixels arranged in the column direction increases, and thus one horizontal period 1H is reduced. As the frequency increases in a display panel of the same resolution, one horizontal period 1H is reduced. Since the decrease of one horizontal period 1H decreases the scan period, it is difficult to secure time to accurately compensate for the threshold voltage of the driving transistor. Accordingly, a pixel driving circuit capable of accurately compensating for the threshold voltage of a driving transistor although the resolution and/or frequency of a display panel increases will be described below.

Figure 2A:
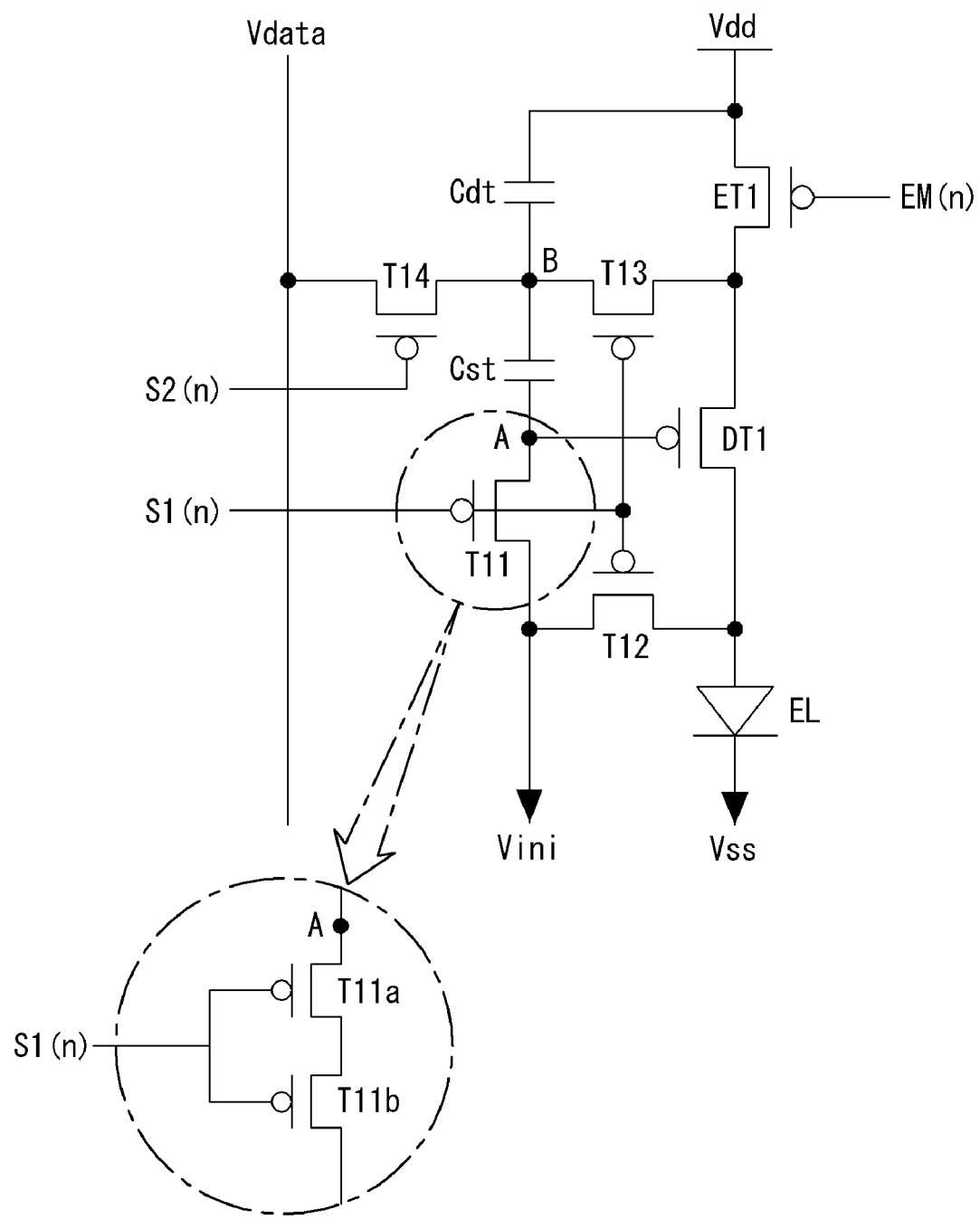
FIGS. 2A and 2B show a pixel driving circuit and a gate signal waveform according to an aspect of the present disclosure.
Figure 2B:
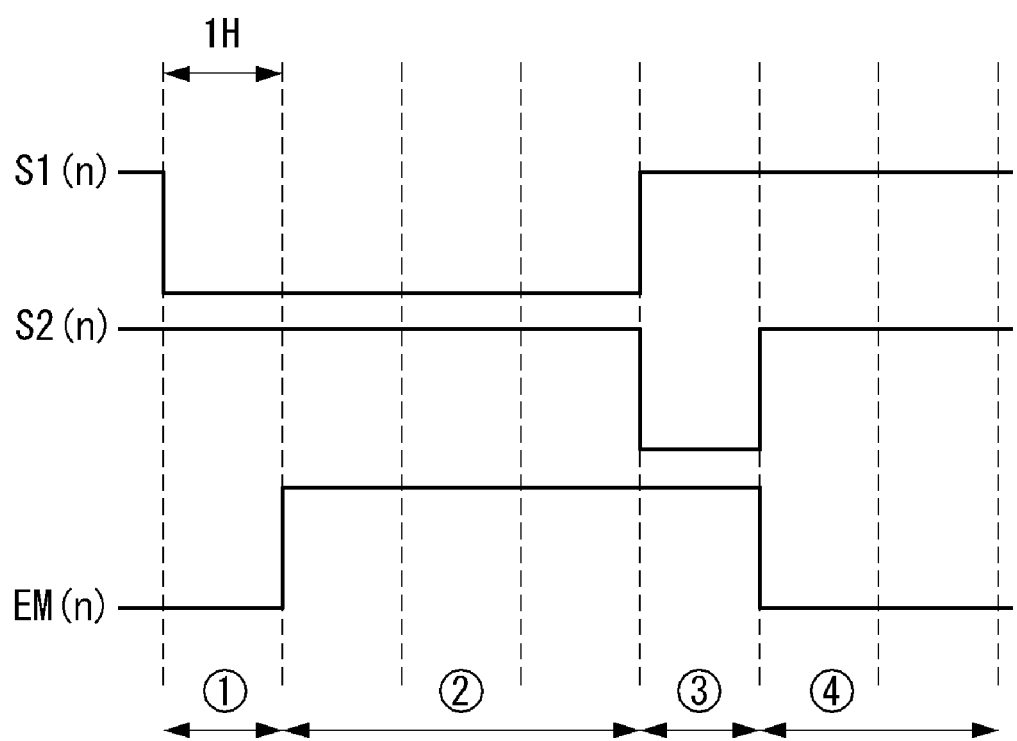

FIGS. 2A and 2B show a pixel driving circuit and a gate signal waveform according to an aspect of the present disclosure. The pixel driving circuit shown in FIG. 2A will be described with regard to an nth subpixel disposed in an nth row of the display area DA.

Referring to FIG. 2A, the pixel driving circuit for supplying a driving current to a light-emitting element EL includes a plurality of transistors and a plurality of capacitors.

The pixel driving circuit according to an aspect of the present disclosure is an internal compensation circuit capable of compensating for the threshold voltage of a driving transistor DT1 through the pixel driving circuit.

Power supply voltages such as a high potential voltage Vdd, a low potential voltage Vss, and an initialization voltage Vini and pixel driving signals such as a first scan signal S1(n), a second scan signal S2(n), an emission signal EM(n), and a data voltage Vdata are applied to the pixel driving circuit.

The scan signals S1(n) and S2(n) and the emission signal EM(n) have an on-level pulse or an off-level pulse at regular time intervals. As an example, the transistors according to an aspect of the present disclosure are implemented as p-type metal oxide semiconductor (PMOS) transistors. Thus, a transistor turn-on voltage is a gate low voltage (or an on-level pulse), and a transistor turn-off voltage is a gate high voltage (an off-level pulse).

The light-emitting element EL emits light by using the amount of current that is adjusted by the driving transistor DT1 according to the data voltage Vdata, thereby representing brightness corresponding to the data gray-scale level of an input image. The light-emitting element EL may include an anode, a cathode, and an organic compound layer formed between the anode and the cathode. The organic compound layer may include a light-emitting layer, a hole injection layer, a hole transport layer, an electron transport layer, and an electron injection layer. However, the present disclosure is not limited thereto. The anode of the light-emitting element EL is connected to the driving transistor DT1, and the cathode of the light-emitting element EL is connected to a low potential voltage electrode to which the low potential voltage Vss is to be applied.

The driving transistor DT1 is a driving element configured to adjust electric current flowing through the light-emitting element EL according to a source-gate voltage Vsg. The driving transistor DT1 includes a gate connected to a first node A, a source, and a drain.

A first capacitor Cst includes two electrodes for forming first capacitance. One of the two electrodes is connected to the first node A, and the other is connected to a second node B. A second capacitor Cdt includes two electrodes for forming second capacitance. One of the two electrodes is connected to the second node B, and the other is connected to the high potential voltage line.

A first switching circuit of the pixel driving circuit according to an aspect of the present disclosure is turned on by the first scan signal S1(n) to initialize the gate of the driving transistor DT1 and the anode of the light-emitting element EL and compensate for the threshold voltage of the driving transistor DT1. The first switching circuit includes three transistors, in particular an eleventh transistor T11, a twelfth transistor T12, and a thirteenth transistor T13.

The eleventh transistor T11 is turned on by the first scan signal S1(n) to provide the initialization voltage Vini to the first node A. The eleventh transistor T11 is connected to the first node A and the initialization voltage line. The eleventh transistor T11 may be implemented as a double-gate transistor. As shown in FIG. 2A, the double-gate transistor has two transistors T11a and T11b controlled by the same signal S1(n) and connected in series. The leakage current of the eleventh transistor T11 may be reduced by implementing the eleventh transistor T11 as a double-gate transistor because the eleventh transistor T11 is connected to the first capacitor Cst. Also, the leakage current of the eleventh transistor T11 may be reduced by increasing a channel length of the transistor T11a, which is one of the two transistors and is more closely connected to the first node A, over a channel length of the transistor T11b, which is more closely connected to the initialization voltage line.

The twelfth transistor T12 is turned on by the first scan signal S1(n) to provide the initialization voltage Vini to the drain of the driving transistor DT1 and the anode of the light-emitting element EL. The twelfth transistor T12 is connected to the initialization voltage line, the drain of the driving transistor DT1, and the anode of the light-emitting element EL.

The thirteenth transistor T13 is turned on by the first scan signal S1(n) to provide the high potential voltage Vdd to the second node B. The thirteenth transistor T13 is connected to the second node B and the source of the driving transistor DT1. The thirteenth transistor T13 may indirectly receive the high potential voltage Vdd through another transistor.

A second switching circuit of the pixel driving circuit according to an aspect of the present disclosure may be turned on by a second scan signal S2(n) to apply the data voltage Vdata to the second node B. Thus, electric current corresponding to the data voltage Vdata may be generated from the driving transistor DT1. The second switching circuit includes a fourteenth transistor T14.

The fourteenth transistor T14 is turned on by the second scan signal S2(n) to provide the data voltage Vdata to the second node B. The fourteenth transistor T14 is connected to the second node B and the data voltage line.

The first scan signal S1(n) and the second scan signal S2(n) are provided to the first switching circuit and the second switching circuit through different scan driving circuits, respectively.

A light emission control circuit of the pixel driving circuit according to an aspect of the present disclosure is turned on by the emission signal EM(n) to provide the high potential voltage Vdd to the driving transistor DT1. Thus, the driving transistor DT1 is turned on to provide a driving current Ioled to the light-emitting element EL. The light emission control circuit includes an emission transistor ET1.

The emission transistor ET1 is turned on by the emission signal EM(n) to provide the high potential voltage Vdd to the driving transistor DT1. The emission transistor ET1 is connected to the high potential voltage line and the source of the driving transistor DT1.

Referring to FIG. 2B, following the first scan signal S1(n), the second scan signal S2(n) synchronized with the data voltage Vdata is supplied to the nth subpixel. The driving of the subpixel may be divided into an initialization period ①, a sampling period ②, a programming period ③, and a emission period ④. The initialization period ① and the programming period ③ have one horizontal period 1H, and the sampling period ② has three horizontal periods 3H. The sampling period ② may be adjusted by the first scan signal S1(n). The first scan signal S1(n) is an on-level pulse during the initialization period ① and the sampling period ② and is an off-level pulse during the programming period ③ and the emission period ④. The second scan signal S2(n) is an on-level pulse during the programming period ③ and is an off-level pulse during the initialization period ①, the sampling period ②, and the emission period ④. The emission signal EM(n) is an on-level pulse during the initialization period ① and the emission period ④ and is an off-level pulse during the sampling period ② and the programming period ③. The emission signal EM(n) is an off-level pulse during about four horizontal periods 4H in which the emission signal EM(n) overlaps the first scan signal S1(n) and the second scan signal S2(n).

FIGS. 3A to 3D are diagrams illustrating operations for driving the pixel driving circuit shown in FIG. 2A. Each operation will be described in conjunction with FIG. 2B.

Figure 3A:
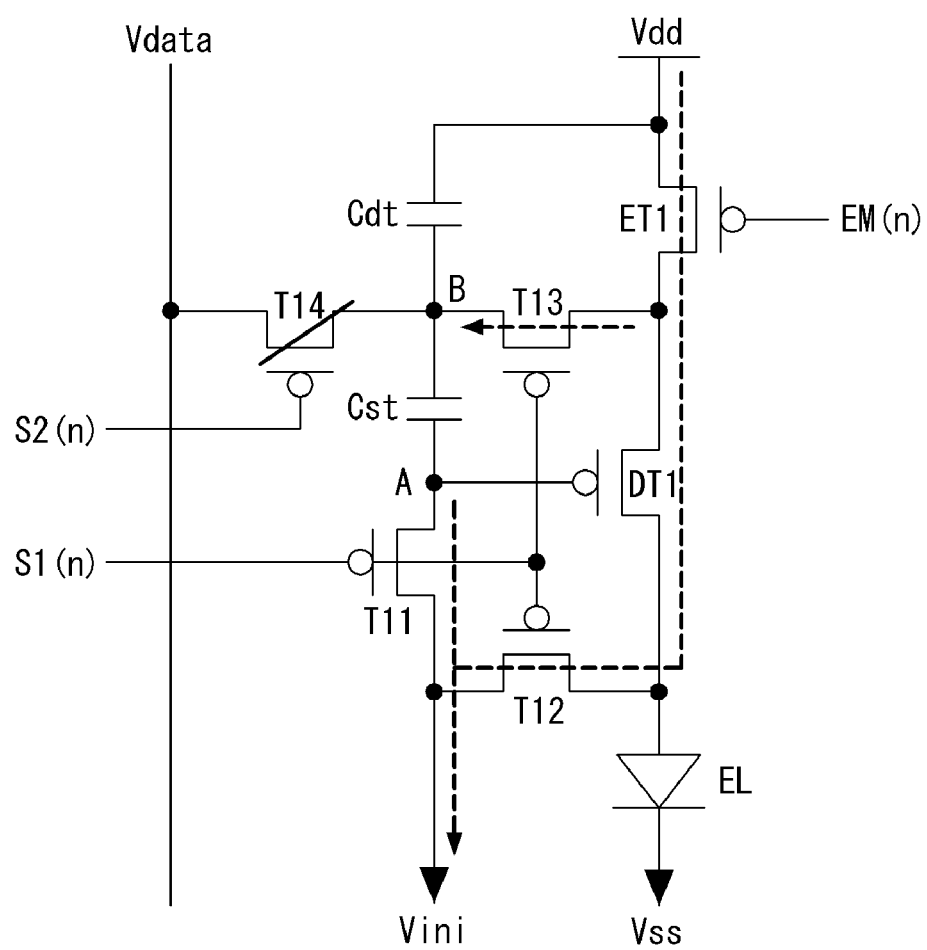
FIGS. 3A to 3D are diagrams illustrating operations for driving the pixel driving circuit shown in FIG. 2A.

FIG. 3A shows an operation of the pixel driving circuit during the initialization period ①. When the initialization period ① starts, the first scan signal S1(n) switches from the off-level pulse to the on-level pulse. When the initialization period ① ends, the emission signal EM(n) switches from the on-level pulse to the off-level pulse. During the initialization period ①, the first switching circuits T11, T12, and T13, the driving transistor DT1, and the light emission control circuit ET1 are turned on. As a result, the first node A and the initialization voltage line are electrically connected to each other, the anode and the initialization voltage line are electrically connected to each other, and the second node B and the high potential voltage line are electrically connected to each other. In this case, the gate of the driving transistor DT1 is discharged with the initialization voltage Vini, and the high potential voltage Vdd is applied to the source of the driving transistor DT1. As a result, the gate-source voltage of the driving transistor DT1 becomes lower than the threshold voltage of the driving transistor DT1. Accordingly, the driving transistor DT1 is turned on. However, since the initialization voltage Vini is lower than the low potential voltage Vss, no current flows to the light-emitting element EL, and thus the light-emitting element EL does not emit light.

Figure 3B:
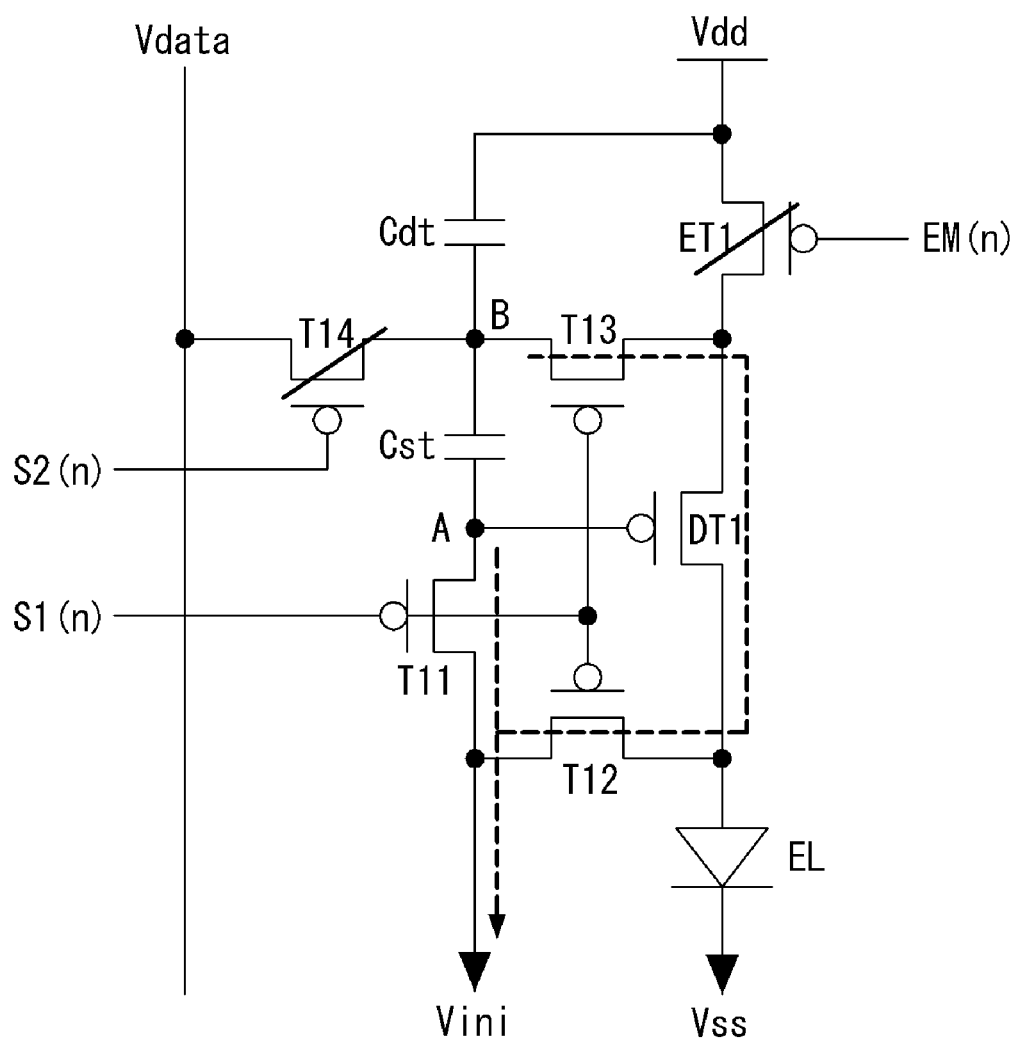

FIG. 3B shows an operation of the pixel driving circuit during the sampling period ②. When the sampling period ② starts, the emission signal EM(n) switches to the off-level pulse, and the first scan signal S1(n) maintains the on-level pulse. During the sampling period ②, the first switching circuits T11, T12, and T13 and the driving transistor DT1 remain turned on. Also, the light emission control circuit ET1 is turned off. Thus, the voltage of the second node B gradually decreases and converges to the sum of the initialization voltage Vini and the threshold voltage of the driving transistor DT1. Accordingly, the threshold voltage value of the driving transistor DT1 is stored in the second node B. In this case, in order to accurately store the threshold voltage value of the driving transistor DT1 in the second node B, sufficient current should flow through turned-on transistors during the sampling period ② so that the driving transistor DT1 can converge to an operating point state. The operating point state of the driving transistor DT1 refers to a state in which the gate-source voltage of the driving transistor DT1 is equal to the threshold voltage of the driving transistor DT1.

In the case of the pixel driving circuit according to an aspect of the present disclosure, the sampling period ② is set to three horizontal periods 3H. However, the present disclosure is not limited thereto. By implementing the pixel driving circuit such that the data voltage Vdata is not used to compensate for the threshold voltage of the driving transistor DT1, the sampling period ② may be secured to be greater than or equal to one horizontal period 1H. The data voltage Vdata is a signal that is provided to subpixels in one row during one horizontal period 1H.

When the data voltage Vdata is used to compensate for the threshold voltage of the driving transistor DT1, the sampling period ② can be set only to one horizontal period 1H or less. In this case, since the sampling period is not sufficiently secured, image quality defects may occur.

Accordingly, by using a separate signal to control a circuit for applying the data voltage Vdata separately from a circuit for compensating for the threshold voltage of the driving transistor DT1, the pixel driving circuit according to an aspect of the present disclosure may sufficiently secure the sampling period ② to exceed one horizontal period 1H, and thus may accurately compensate for the threshold voltage of the driving transistor DT1. Also, even though the resolution and frequency of the display panel 101 increase, sufficient compensation time may be secured, and sampling time ② may be actively adjusted according to the resolution and frequency of the display panel 101.

Figure 3C:
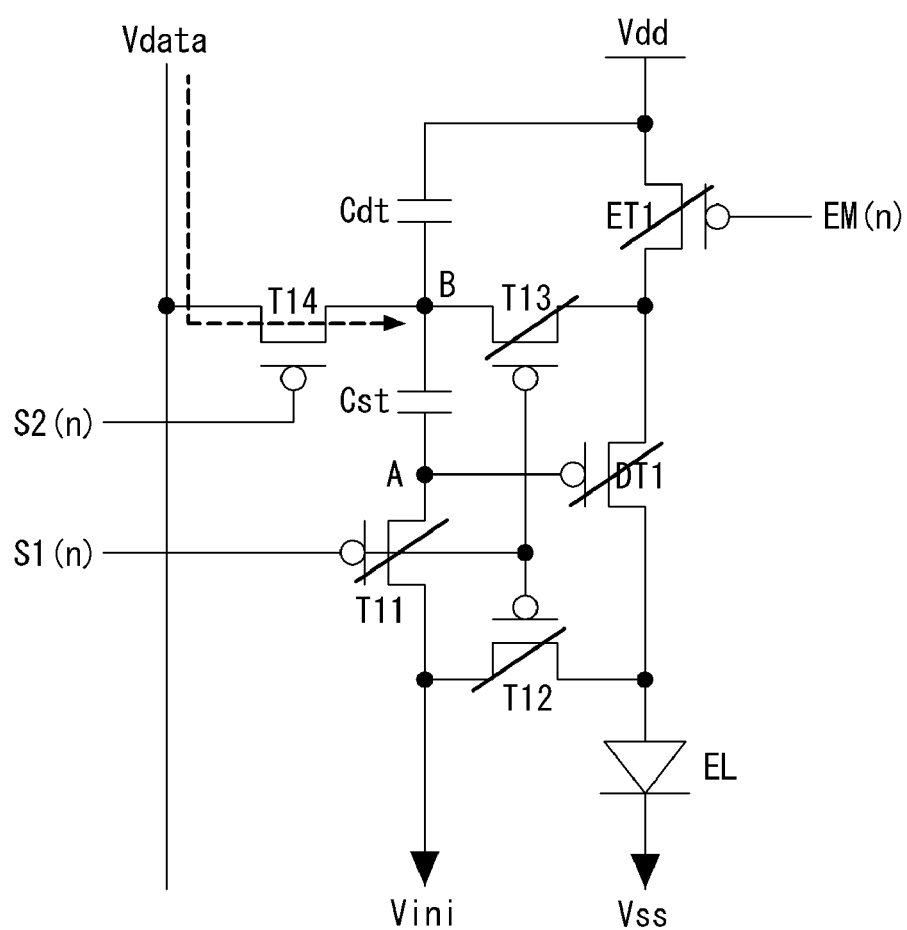

FIG. 3C shows an operation of the pixel driving circuit during the programming period ③. When the programming period ③ starts, the first scan signal S1(n) switches from the on-level pulse to the off-level pulse, and the second scan signal S2(n) switches from the off-level pulse to the on-level pulse. During the programming period ③, the second switching circuit T14 is turned on to electrically connect the data voltage line to the second node B. The first switching circuits T11, T12, and T13, the driving transistor DT1, and the light emission control circuit ET1 are turned off. In this case, since the first node A is floating, the voltage change of the second node B is reflected in the first node A due to the coupling effect of the first capacitor Cst. Accordingly, the data voltage Vdata is applied to the second node B, and the difference between the data voltage Vdata and the threshold voltage of the driving transistor DT1 is applied to the first node A. Also, the high potential voltage Vdd and the data voltage Vdata are applied to the two electrodes forming the second capacitor Cdt. Since the second capacitor Cdt is disposed between and connected to the first capacitor Cst and the high potential voltage line without directly connecting the first capacitor Cst to the high potential voltage line, the data voltage Vdata may be applied to the second node B.

Figure 3D:
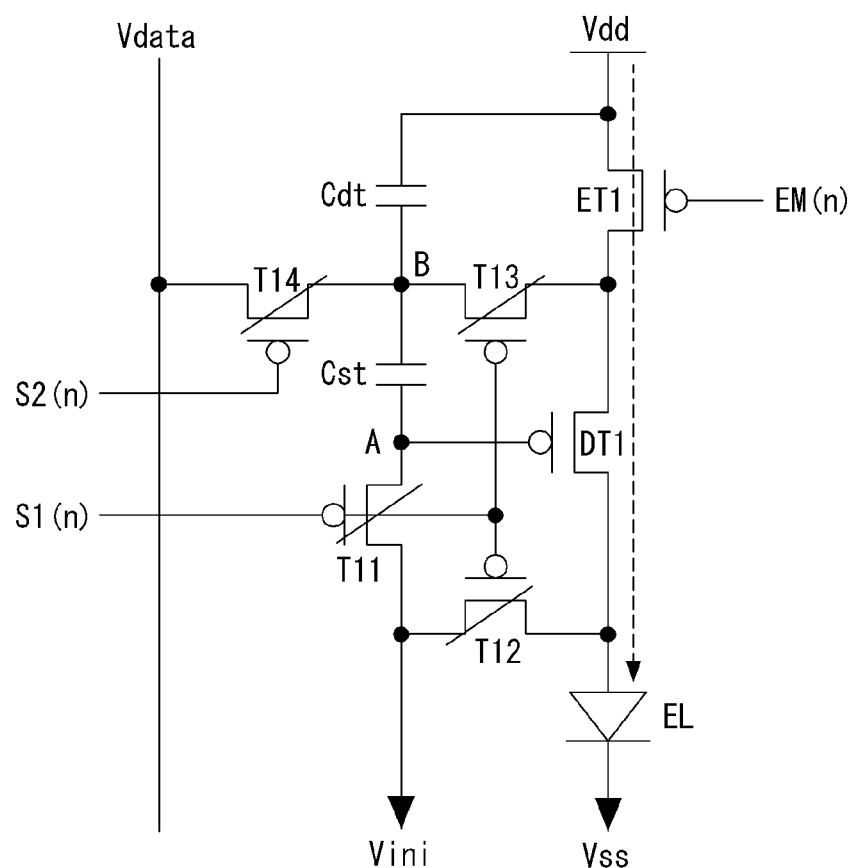

FIG. 3D shows an operation of the driving circuit during the emission period ④. When the emission period ④ starts, the second scan signal S2(n) switches from the on-level pulse to the off-level pulse, and the emission signal EM(n) switches from the off-level pulse to the on-level pulse. During the emission period ④, the light emission control circuit ET1 is turned on to electrically connect the high potential voltage Vdd to the source of the driving transistor DT1, and the driving transistor DT1 is turned on to provide the driving current Ioled to the light-emitting element EL. The driving current Ioled corresponds to Equation 1.

$$I_{oled} = \frac{1}{2}\frac{L}{W}C_{ox}\mu_p(V_{dd} - V_{data})^2 \qquad \text{[Equation 1]}$$

L is the channel length of the driving transistor DT1, W is the channel width of the driving transistor DT1, Cox is parasitic capacitance between an active electrode and the gate of the driving transistor DT1, and μp is mobility of the driving transistor DT1. Referring to Equation 1, since the threshold voltage value of the driving transistor is removed from the driving current Ioled, the driving current Ioled does not depend on the threshold voltage of the driving transistor and is not affected even by the change of the threshold voltage.

The first capacitor Cst may constantly provide the driving current Ioled to the light-emitting element EL by maintaining a constant voltage applied to the gate of the driving transistor DT1 during the emission period ④.

Figure 4:
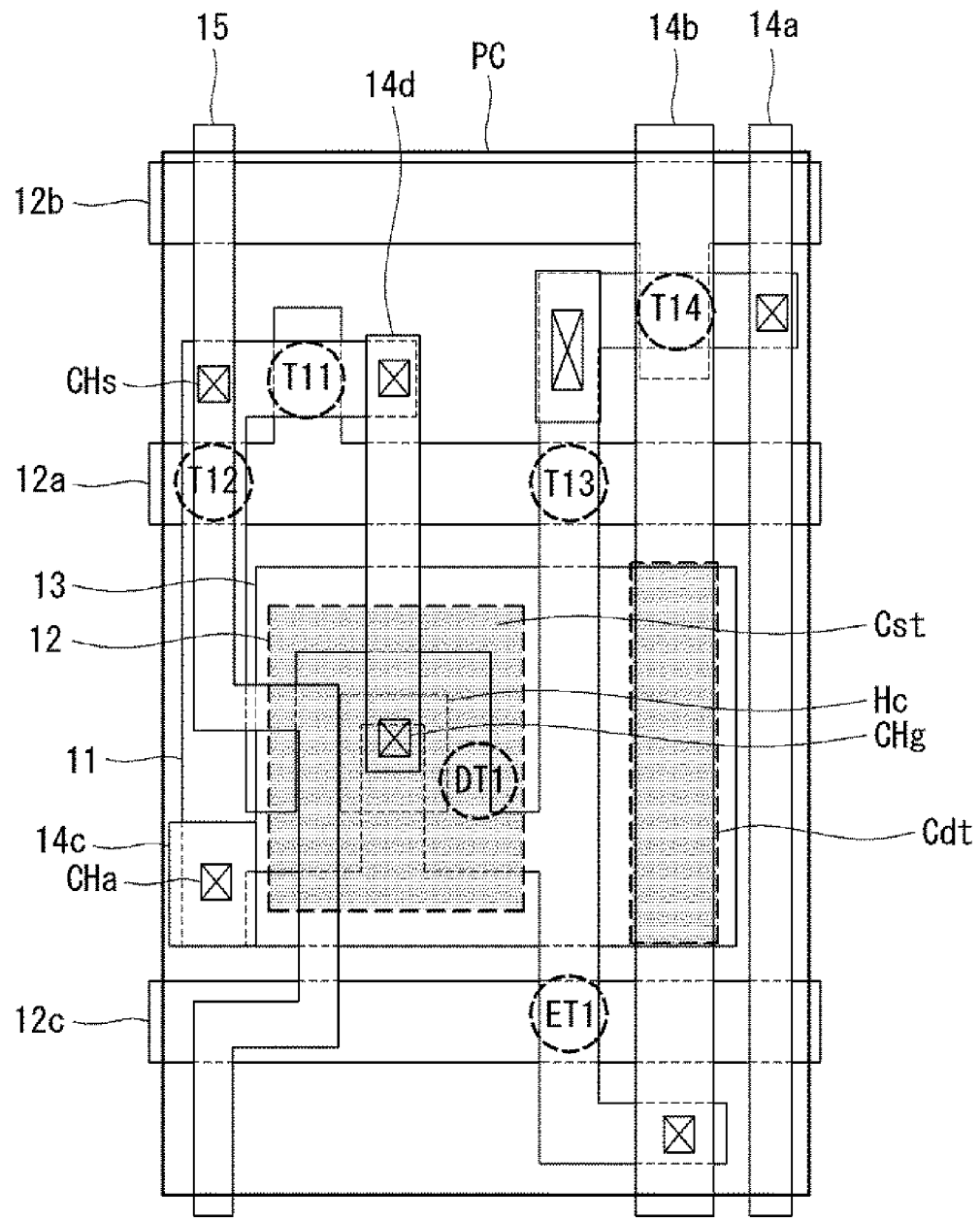
FIG. 4 is a layout diagram of the pixel driving circuit shown in FIG. 2A.
Figure 5:
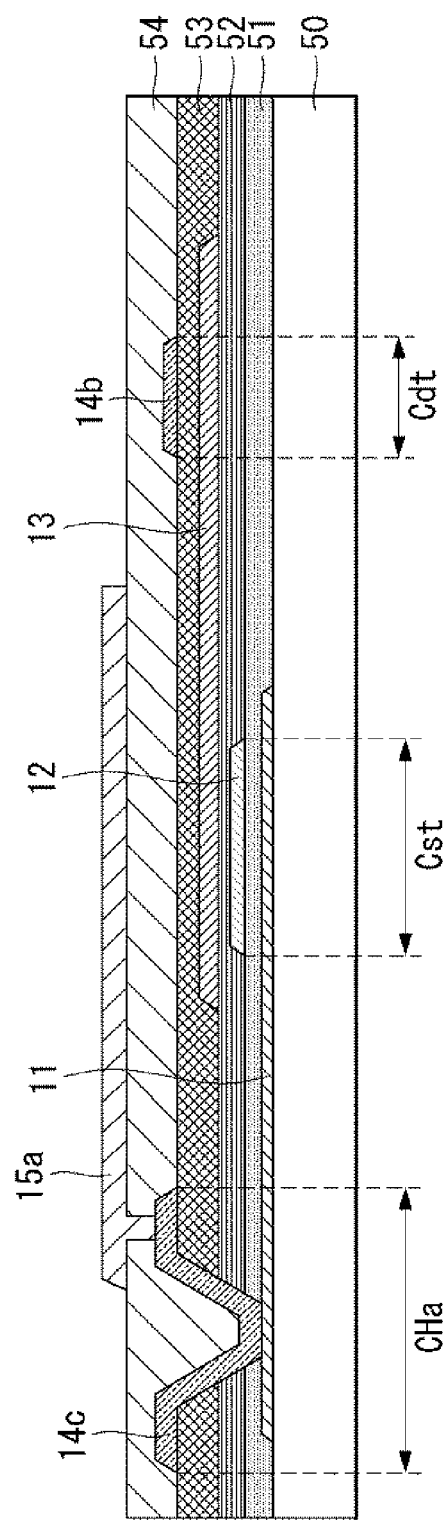
FIG. 5 is a sectional view of a portion of FIG. 4.

FIG. 4 is a layout diagram of the pixel driving circuit shown in FIG. 2A, and FIG. 5 is a sectional view of a portion of FIG. 4.

Referring to FIG. 4, a data line 14a, a high potential voltage line 14b, and an initialization voltage line 15 are arranged in the column direction, and a first scan line 12a, a second scan line 12b, and an emission line 12c are arranged in the row direction. Also, an active electrode 11 is connected to and formed integrally with where the channels of the transistors included in the first switching circuit, the second switching circuit, the driving transistor, and the light emission control circuit should be formed.

The eleventh transistor T11 and the twelfth transistor T12 are disposed adjacent to each other, and one electrodes of the eleventh transistor T11 and the twelfth transistor T12 are connected to the initialization voltage line 15 through the same contact hole (a source contact hole CHs). The source contact hole CHs may overlap the initialization voltage line 15 so that the initialization voltage line 15 does not have to be branched. The initialization voltage line 15 is shown as being formed on a layer different from that of the data line 14a and the high potential voltage line 14b and as being formed of the same material as the anode electrode. However, the present disclosure is not limited thereto, and the initialization voltage line 15 may be formed on the same layer and of the same material as the data line 14a and the high potential voltage line 14b.

The gate 12 of the driving transistor DT1 is connected to the other electrode 14d of the eleventh transistor T11 through a gate contact hole CHg. The thirteenth electrode 13 of the first capacitor Cst forms a hole Hc to surround the gate contact hole CHg so that the other electrode 14d of the eleventh transistor T11 and the gate 12 of the driving transistor DT1 are brought into contact with each other. The hole Hc formed by the thirteenth electrode 13 may not be short-circuited with the other electrode 14d of the eleventh transistor T11 and the gate 12 of the driving transistor DT1. The other electrode 14d of the eleventh transistor T11 may be formed on the same layer and of the same material as the data line 14a and the high potential voltage line 14b. The source of the driving transistor DT1 is connected to the high potential voltage line 14b through the light emission control circuit ET1. Referring to FIG. 5, the drain of the driving transistor DT1 is connected to the anode electrode 15a through an anode contact hole CHa. The drain electrode connected to a drain area of the active electrode 11 of the driving transistor DT1 is connected to the anode electrode 15a through a connection electrode 14c formed on the anode contact hole CHa. When the initialization voltage line 15 is formed of the same material as the anode electrode, the anode electrode 15a and the initialization voltage line 15 are formed on the same layer and spaced apart from each other. In this case, the initialization voltage line 15 may be formed to bypass the anode contact hole CHa so that the initialization voltage line 15 cannot be short-circuited with the anode contact hole CHa. The anode electrode 15a does not overlap the initialization voltage line 15 and is formed separately for each subpixel. Also, the connection electrode 14c may be formed on the same layer and of the same material as the data line 14a and the high potential voltage line 14b.

The first capacitor Cst includes a thirteenth electrode 13 and a twelfth electrode 12, and the thirteenth electrode 13 serves as one electrode of the first capacitor Cst. The twelfth electrode 12 is located below the thirteenth electrode 13, overlaps the thirteenth electrode 13 to form the first capacitance, and is the gate of the driving transistor DT1. The thirteenth electrode 13 is formed to be larger than the twelfth electrode 12 to overlap the twelfth electrode 12. FIG. 5 is a sectional view of an area where the first capacitor Cst and the active electrode 11 overlap each other. However, the present disclosure is not limited thereto, and the area where the first capacitor Cst and the active electrode 11 do not overlap may be included in an area where the first capacitance is formed.

The second capacitor Cdt includes a twenty-first electrode and a twenty-second electrode. The twenty-first electrode is a part where the thirteenth electrode 13 of the first capacitor Cst extends and overlaps the high potential voltage line 14b, and the twenty-second electrode is a portion of the high potential voltage line 14b overlapping the twenty-first electrode. The second capacitance is formed in an area where the twenty-first electrode and the twenty-second electrode overlap each other. The first capacitor Cst and the second capacitor Cdt share the same electrode 13 and form capacitance in different areas of the same electrode 13 while not overlapping each other.

During most of one frame, the first capacitor Cst has capacitance such that the voltage of the gate of the driving transistor DT1 can remain constant. The capacitance of the first capacitor Cst is higher than the capacitance of the second capacitor Cdt in order to reduce the influence of kick-back and improve compensation performance. Since the capacitance is proportional to the area of the electrode of the capacitor, the area of the first capacitor Cst is greater than the area of the second capacitor Cdt. In detail, in order to improve the efficiency with which the data voltage Vdata is transferred to the gate of the driving transistor DT1, the area of the first capacitor Cst is more than twice as large as the area of the second capacitor Cdt. For example, it is assumed that the area of the first capacitor Cst is less than twice as large as the area of the second capacitor Cdt. When the data voltage Vdata is 5 V, only 2.5 V is applied to the gate of the driving transistor DT1, and thus it is difficult to implement a black screen. The area of the driving capacitor refers to an area where two electrodes forming capacitance overlap each other.

Referring to FIG. 5, the active electrode 11, the twelfth electrode 12 of the first capacitor Cst, which is the gate electrode of the driving transistor DT1, the twenty-first electrode of the second capacitor Cdt, which is the thirteenth electrode 13 of the first capacitor Cst, and the high potential voltage line 14b are sequentially stacked on a substrate 50. Insulating layers 51, 52, 53, and 54 are formed between the electrodes to insulate the electrodes in the entire area except for contact holes. The insulating layers 51, 52, and 53 may be mainly formed of a silicon-based inorganic material, and the insulating layer 54 covering a power supply line may be formed of a polyacrylic- or polyimide-based inorganic material. Thus, a stepped portion of the substrate due to the electrodes formed on the substrate 50 may be reduced.

The features of the layout and the cross-section which have been described above may be equally applied to other aspects to be described below.

Figure 6A:
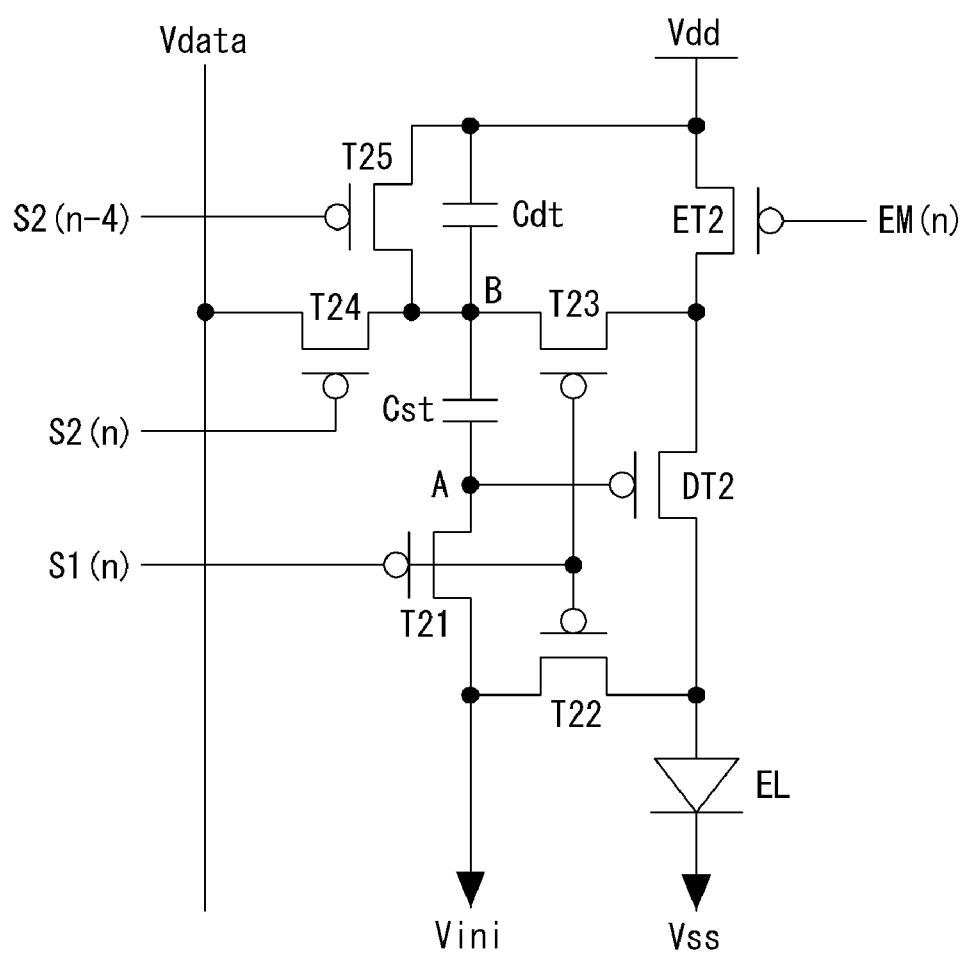

FIGS. 6A and 6B show a pixel driving circuit and a gate signal waveform according to an aspect of the present disclosure. The pixel driving circuit shown in FIG. 6A will be described with regard to the nth subpixel disposed in the nth row of the display area DA. The pixel driving circuit of FIG. 6A is a circuit that additionally includes a third switching circuit controlled by a second scan signal S2(n−4) applied to an (n−4)th subpixel, and thus a description overlapping with the foregoing description with reference to FIG. 2A will be omitted or simplified.

The pixel driving circuit according to an aspect of the present disclosure is an internal compensation circuit capable of compensating for the threshold voltage of a driving transistor DT2 through the pixel driving circuit.

Power supply voltages such as a high potential voltage Vdd, a low potential voltage Vss, and an initialization voltage Vini and pixel driving signals such as a first scan signal S1($n$), a second scan signal S2($n$), a second scan signal S2($n$-4) applied to an ($n$-4)th subpixel, an emission signal EM(n), and a data voltage Vdata are applied to the pixel driving circuit.

As an example, the transistors according to an aspect of the present disclosure are implemented as PMOS transistors.

The light-emitting element EL emits light by using the amount of current that is adjusted by the driving transistor DT2 according to the data voltage Vdata, thereby representing brightness corresponding to the data gray level of an input image. The anode of the light-emitting element EL is connected to the driving transistor DT2, and the cathode of the light-emitting element EL is connected to a low potential voltage electrode to which the low potential voltage Vss is to be applied.

The driving transistor DT2 is a driving element configured to adjust electric current flowing through the light-emitting element EL according to a gate-source voltage Vgs. The driving transistor DT2 includes a gate connected to a first node A, a source, and a drain.

A first capacitor Cst includes two electrodes for forming first capacitance. One of the two electrodes is connected to the first node A, and the other is connected to a second node B. A second capacitor Cdt includes two electrodes for forming second capacitance. One of the two electrodes is connected to the second node B, and the other is connected to the high potential voltage line.

A first switching circuit of the pixel driving circuit according to an aspect of the present disclosure is turned on by the first scan signal S1($n$) to initialize the gate of the driving transistor DT2 and the anode of the light-emitting element EL and compensate for the threshold voltage of the driving transistor DT2. The first switching circuit includes a twenty-first transistor T21, a twenty-second transistor T22, and a twenty-third transistor T23. Like the preceding aspect, in order for the data voltage Vdata not to be used to compensate for the threshold voltage of the driving transistor DT1, the first switching circuit does not include a transistor for applying the data voltage Vdata to the pixel driving circuit.

The twenty-first transistor T21 is turned on by the first scan signal S1($n$) to provide the initialization voltage Vini to the first node A. The twenty-first transistor T21 is connected to the first node A and the initialization voltage line. The leakage current of the twenty-first transistor T21, which is connected to the first capacitor Cst, may be reduced by implementing the twenty-first transistor T21 as a double-gate transistor. Also, the leakage current of the twenty-first transistor T21 may be reduced by increasing a channel length of one of the two transistors constituting the double-gate transistor, which is a transistor more closely connected to the first node A, more than a channel length of the other transistor, which is a transistor more closely connected to the initialization voltage line.

The twenty-second transistor T22 is turned on by the first scan signal S1($n$) to provide the initialization voltage Vini to the anode of the light-emitting element EL. The twenty-second transistor T22 is connected to the initialization voltage line and the anode of the light-emitting element EL.

The twenty-third transistor T23 is turned on by the first scan signal S1($n$) to provide the high potential voltage Vdd to the second node B. The twenty-third transistor T23 is connected to the second node B and the source of the driving transistor DT2. The twenty-third transistor T23 may indirectly receive the high potential voltage Vdd through another transistor.

A second switching circuit of the pixel driving circuit according to an aspect of the present disclosure may be turned on by a second scan signal S2($n$) to apply the data voltage Vdata to the second node B. Thus, electric current corresponding to the data voltage Vdata may be generated from the driving transistor DT2. The second switching circuit includes a twenty-fourth transistor T24.

The twenty-fourth transistor T24 is turned on by the second scan signal S2($n$) to provide the data voltage Vdata to the second node B. The twenty-fourth transistor T24 is connected to the second node B and the data voltage line.

The first scan signal S1($n$) and the second scan signal S2($n$) are provided to the first switching circuit and the second switching circuit through different scan driving circuits, respectively.

The pixel driving circuit according to an aspect of the present disclosure is turned on by the second scan signal S2($n$-4) applied to the ($n$-4)th subpixel to apply the high potential voltage Vdd to the second node B by including a third switching circuit. The third switching circuit prevents the high potential voltage line from being short-circuited with the initialization voltage line and the low potential voltage electrode during the initialization period. The third switching circuit includes a twenty-fifth transistor T25.

The twenty-fifth transistor T25 is turned on by the second scan signal S2($n$-4) applied to the ($n$-4)th subpixel to provide the high potential voltage Vdd to the second node B. The twenty-fifth transistor T25 is connected to the second node B and the high potential voltage line.

A light emission control circuit of the pixel driving circuit according to an aspect of the present disclosure is turned on by the emission signal EM(n) to provide the high potential voltage Vdd to the driving transistor DT2. Thus, the driving transistor DT2 is turned on to provide a driving current Ioled to the light-emitting element EL. The light emission control circuit includes an emission transistor ET2.

The emission transistor ET2 is turned on by the emission signal EM(n) to provide the high potential voltage Vdd to the driving transistor DT2. The emission transistor ET2 is connected to the high potential voltage line and one electrode of the driving transistor DT2.

Referring to FIG. 6B, prior to the first scan signal S1($n$), the second scan signal S2($n$-4) applied to the ($n$-4)th subpixel is supplied to the nth subpixel. Following the first scan signal S1($n$), the second scan signal S2($n$) synchronized with the data voltage Vdata is supplied to the nth subpixel. The driving of the subpixel may be divided into an initialization period ①, a sampling period ②, a programming period ③, and a emission period ④.

The initialization period ① is one horizontal period 1H, and the emission signal EM(n) and the second scan signal S2($n$-4) applied to the ($n$-4)th subpixel are on-level pulses during the initialization period ①. The twenty-fifth transistor T25 is turned on by the second scan signal S2($n$-4) applied to the ($n$-4)th subpixel to apply the high potential voltage Vdd to the second node B. Also, the emission transistor ET2 is turned on by the emission signal EM(n) to apply the high potential voltage Vdd to the source of the driving transistor DT2. During the initialization period ①, the source of the driving transistor DT2 and the second node B are set to the high potential voltage Vdd.

The sampling period ② is shown as having three horizontal periods 3H. However, the present disclosure is not limited thereto. The sampling period ② may be adjusted by the first scan signal S1(n). During the sampling period ②, the first scan signal S1(n) is an on-level pulse and the emission signal EM(n) is an off-level pulse. During the sampling period ②, the first switching circuits T21, T22, and T23, which have been turned on, discharge the gate of the driving transistor DT2 and the anode of the light-emitting element EL with the initialization voltage and turn on the driving transistor DT2 to sense the threshold voltage of the driving transistor DT2.

In the case of the driving circuit according to an aspect of the present disclosure, the sampling period ② is set to three horizontal periods 3H. However, the present disclosure is not limited thereto. By implementing the pixel driving circuit such that the data voltage Vdata is not used to compensate for the threshold voltage of the driving transistor DT2, the sampling period ② may be secured to be greater than or equal to one horizontal period 1H.

By using a separate signal to control a circuit for applying the data voltage Vdata separately from a circuit for compensating for the threshold voltage of the driving transistor DT2, the pixel driving circuit according to an aspect of the present disclosure may sufficiently secure the sampling period ② to exceed one horizontal period 1H and thus may accurately compensate for the threshold voltage of the driving transistor DT2. Also, even though the resolution and frequency of the display panel 101 increase, sufficient compensation time may be secured, and sampling time ② may be adjusted according to the resolution and frequency of the display panel 101.

The programming period ③ is one horizontal period 1H, and the second scan signal S2(n) is an on-level pulse during the programming period ③. The first switching circuits T21, T22, and T23, the driving transistor DT2, and the light emission control circuit ET2 are turned off. The twenty-fourth transistor T24 is turned on by the second scan signal S2(n) to apply the data voltage Vdata to the second node B, and the difference between the threshold voltage of the driving transistor DT2 and the data voltage Vdata is applied to the first node A due to the coupling effect of the first capacitor Cst. Also, the high potential voltage Vdd and the data voltage Vdata are applied to the two electrodes forming the second capacitor Cdt. Since the second capacitor Cdt is disposed between and connected to the first capacitor Cst and the high potential voltage line without directly connecting the first capacitor Cst to the high potential voltage line, the data voltage Vdata may be applied to the second node B.

During the emission period ④, the emission signal EM(n) is an on-level pulse, and the second scan signal S2(n) is an off-level pulse. The emission signal EM(n) maintains an off-level pulse during about four horizontal periods 4H in which the emission signal EM(n) overlaps the first scan signal S1(n) and the second scan signal S2(n).

During the emission period ④, the light emission control circuit ET2 is turned on to electrically connect the high potential voltage Vdd to the source of the driving transistor DT2, and the driving transistor DT2 is turned on to provide the driving current Ioled to the light-emitting element EL. The driving current Ioled corresponds to Equation 1. Referring to Equation 1, since the threshold voltage value of the driving transistor is removed from the driving current Ioled, the driving current Ioled does not depend on the threshold voltage of the driving transistor and is not affected even by the change of the threshold voltage.

The first capacitor Cst may constantly provide the driving current Ioled to the light-emitting element EL by maintaining a constant voltage applied to the gate of the driving transistor DT2 during the emission period ④.

Figure 7A:
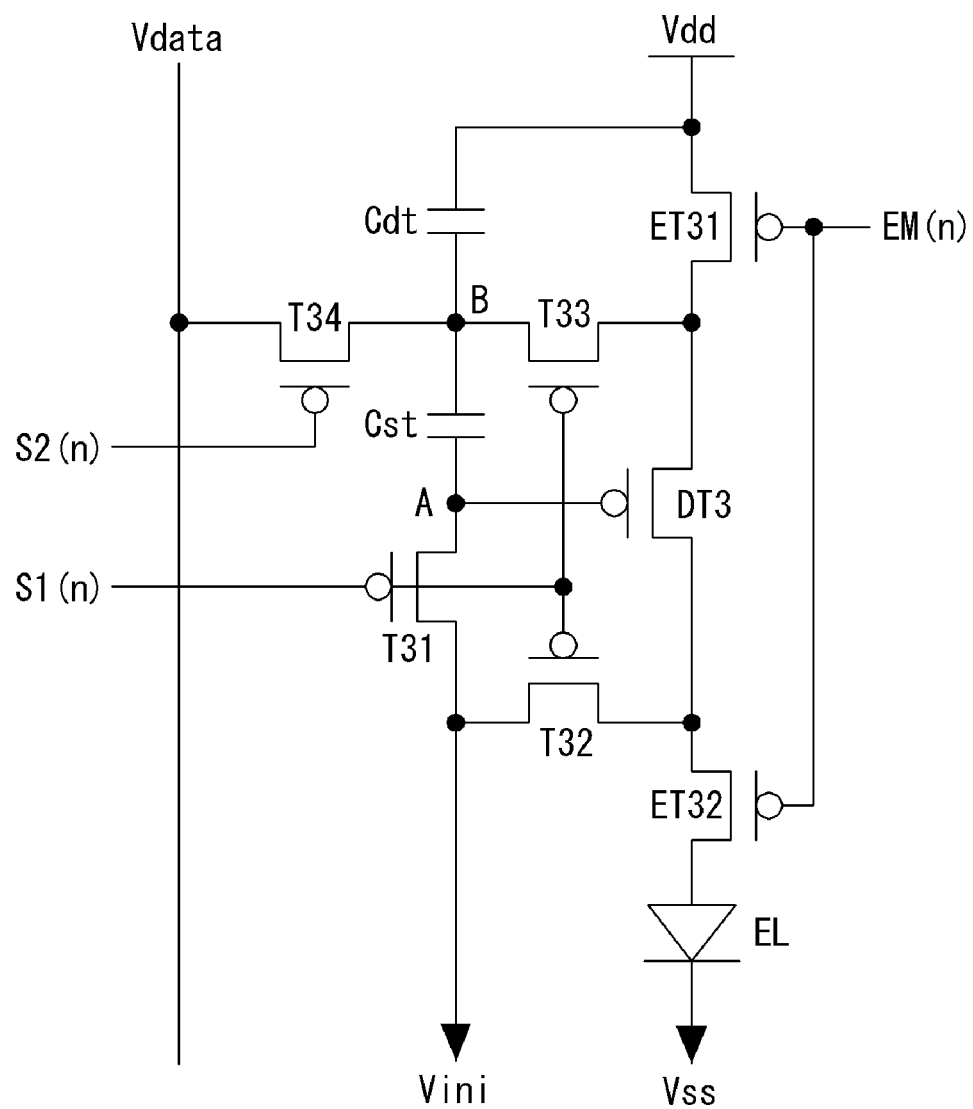
FIGS. 7A and 7B show a pixel driving circuit and a gate signal waveform according to an aspect of the present disclosure.
Figure 7B:
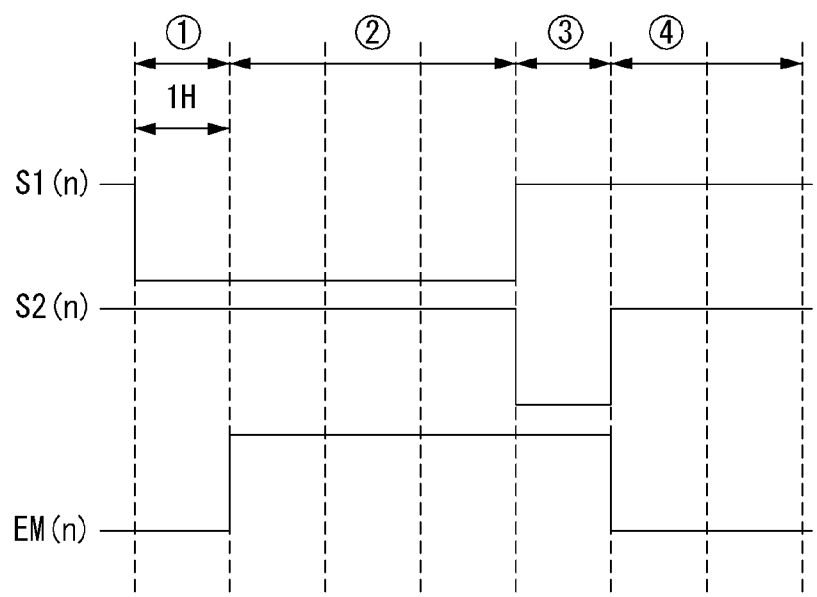

FIGS. 7A and 7B show a pixel driving circuit and a gate signal waveform according to an aspect of the present disclosure. The driving circuit shown in FIG. 7A will be described with regard to the nth subpixel disposed in the nth row of the display area DA. The driving circuit of FIG. 7A is a circuit in which an emission transistor ET32 is added to the driving circuit of FIG. 2A, and thus a description overlapping with the foregoing description with reference to FIG. 2A will be omitted or simplified.

The driving circuit according to an aspect of the present disclosure is an internal compensation circuit capable of compensating for the threshold voltage of a driving transistor DT3 through the driving circuit.

Power supply voltages such as a high potential voltage Vdd, a low potential voltage Vss, and an initialization voltage Vini and pixel driving signals such as a first scan signal S1(n), a second scan signal S2(n), an emission signal EM(n), and a data voltage Vdata are applied to the driving circuit.

As an example, the transistors according to an aspect of the present disclosure are implemented as PMOS transistors.

The light-emitting element EL emits light by using the amount of current that is adjusted by the driving transistor DT3 according to the data voltage Vdata, thereby representing brightness corresponding to the data gray level of an input image. The anode of the light-emitting element EL is connected to the light emission control circuit, and the cathode of the light-emitting element EL is connected to a low potential voltage electrode to which the low potential voltage Vss is to be applied.

The driving transistor DT3 is a driving element configured to adjust electric current flowing through the light-emitting element EL according to a gate-source voltage Vgs. The driving transistor DT3 includes a gate connected to a first node A, a source, and a drain.

A first capacitor Cst includes two electrodes for forming first capacitance. One of the two electrodes is connected to the first node A, and the other is connected to a second node B. A second capacitor Cdt includes two electrodes for forming second capacitance. One of the two electrodes is connected to the second node B, and the other is connected to the high potential voltage line.

A first switching circuit of the pixel driving circuit according to an aspect of the present disclosure is turned on by the first scan signal S1(n) to initialize the gate and drain of the driving transistor DT3 and compensate for the threshold voltage of the driving transistor DT3. The first switching circuit includes a thirty-first transistor T31, a thirty-second transistor T32, and a thirty-third transistor T33. Like the preceding aspect, in order for the data voltage Vdata not to be used to compensate for the threshold voltage of the driving transistor DT3, the first switching circuit does not include a transistor for applying the data voltage Vdata to the pixel driving circuit.

The thirty-first transistor T31 is turned on by the first scan signal S1(n) to provide the initialization voltage Vini to the first node A. The thirty-first transistor T31 is connected to the first node A and the initialization voltage line. The leakage current of the thirty-first transistor T31, which is connected to the first capacitor Cst, may be reduced by implementing the thirty-first transistor T31 as a double-gate transistor. Also, the leakage current of the thirty-first transistor T31 may be reduced by increasing a channel length of one of the two transistors constituting the double-gate transistor, which is a transistor more closely connected to the first node A, more than a channel length of the other transistor, which is a transistor more closely connected to the initialization voltage line.

The thirty-second transistor T32 is turned on by the first scan signal S1(n) to provide the initialization voltage Vini to the drain of the driving transistor DT3. The thirty-second transistor T32 is connected to the initialization voltage line and the drain of the driving transistor DT3.

The thirty-third transistor T33 is turned on by the first scan signal S1(n) to provide the high potential voltage Vdd to the second node B. The thirty-third transistor T33 is connected to the second node B and the source of the driving transistor DT3. The thirty-third transistor T33 may indirectly receive the high potential voltage Vdd through another transistor.

A second switching circuit of the driving circuit according to an aspect of the present disclosure may be turned on by a second scan signal S2(n) to apply the data voltage Vdata to the second node B. Thus, electric current corresponding to the data voltage Vdata may be generated from the driving transistor DT3. The second switching circuit includes a thirty-fourth transistor T34.

The thirty-fourth transistor T34 is turned on by the second scan signal S2(n) to provide the data voltage Vdata to the second node B. The thirty-fourth transistor T34 is connected to the second node B and the data voltage line.

The first scan signal S1(n) and the second scan signal S2(n) are provided to the first switching circuit and the second switching circuit through different scan driving circuits, respectively.

A light emission control circuit of the driving circuit according to an aspect of the present disclosure is turned on by the emission signal EM(n) to provide the high potential voltage Vdd to the driving transistor DT2. Thus, the driving transistor DT3 is turned on to generate the driving current Ioled and form a current path between the driving transistor DT3 and the light-emitting element EL. The light emission control circuit includes a first emission transistor ET31 and a second emission transistor ET32.

The first emission transistor ET31 is turned on by the emission signal EM(n) to provide the high potential voltage Vdd to the driving transistor DT3. The first emission transistor ET31 is connected to the high potential voltage line and the source of the driving transistor DT3.

The second emission transistor ET32 is turned on by the emission signal EM(n) to provide the driving current generated by the driving transistor DT3 to the anode of the light-emitting element EL. When the second emission transistor ET32 is additionally included, resistance increases compared to a structure with only the first emission transistor ET31. Thus, current that may flow to the light-emitting element EL during the initialization period may be further decreased. Therefore, since the black screen becomes darker, it is possible to improve the contrast ratio of the display panel. Also, the anode of the light-emitting element EL is discharged with the initialization voltage during the initialization period.

Referring to FIG. 7B, following the first scan signal S1(n), the second scan signal S2(n) synchronized with the data voltage Vdata is supplied to the nth subpixel. The driving of the subpixel may be divided into an initialization period ①, a sampling period ②, a programming period ③, and a emission period ④.

The initialization period is one horizontal period 1H, and the first scan signal S1(n) and the emission signal EM(n) are on-level pulses during the initialization period ①. Therefore, the first switching circuits T31, T32, and T33, the driving transistor DT3, and the light emission control circuits ET31 and ET32 are turned on. As a result, the first node A and the initialization voltage line are electrically connected to each other, the anode and the initialization voltage line are electrically connected to each other, and the second node B and the high potential voltage line are electrically connected to each other.

During the sampling period ②, the first scan signal S1(n) is an on-level pulse, and the emission signal EM(n) is an off-level pulse. The first switching circuits T31, T32, and T33 and the driving transistor DT3, which are turned on during the sampling period ②, sense the threshold voltage of the driving transistor DT3.

In the case of the pixel driving circuit according to an aspect of the present disclosure, the sampling period ② is set to three horizontal periods 3H. However, the present disclosure is not limited thereto. By implementing the pixel driving circuit such that the data voltage Vdata is not used to compensate for the threshold voltage of the driving transistor DT3, the sampling period ② may be secured to be greater than or equal to one horizontal period 1H.

By using a separate signal to control a circuit for applying the data voltage Vdata separately from a circuit for compensating for the threshold voltage of the driving transistor DT3, the pixel driving circuit according to an aspect of the present disclosure may sufficiently secure the sampling period ② to exceed one horizontal period 1H and thus may accurately compensate for the threshold voltage of the driving transistor DT3. Also, even though the resolution and frequency of the display panel 101 increase, sufficient compensation time may be secured, and sampling time ② may be adjusted according to the resolution and frequency of the display panel 101.

During the programming period ③, the second switching circuit T34 is turned on to electrically connect the data voltage line to the second node B. The first switching circuits T31, T32, and T33, the driving transistor DT3, and the light emission control circuits ET31 and ET32 are turned off. In this case, the data voltage Vdata is applied to the second node B, and the difference between the data voltage Vdata and the threshold voltage of the driving transistor DT3 is applied to the first node A due to the coupling effect of the first capacitor Cst. Also, the high potential voltage Vdd and the data voltage Vdata are applied to the two electrodes forming the second capacitor Cdt. Since the second capacitor Cdt is disposed between and connected to the first capacitor Cst and the high potential voltage line without directly connecting the first capacitor Cst to the high potential voltage line, the data voltage Vdata may be applied to the second node B.

During the emission period ④, the light emission control circuits ET31 and ET32 are turned on to electrically connect the high potential voltage Vdd to the source of the driving transistor DT3, and the driving transistor DT3 is turned on to provide the driving current Ioled to the light-emitting element EL. The driving current Ioled corresponds to Equation 1. Referring to Equation 1, since the threshold voltage value of the driving transistor is removed from the driving current Ioled, the driving current Ioled does not depend on the threshold voltage of the driving transistor and is not affected even by the change of the threshold voltage.

The first capacitor Cst may constantly provide the driving current Ioled to the light-emitting element EL by maintaining a constant voltage applied to the gate of the driving transistor DT3 during the emission period ④.

Figure 8:
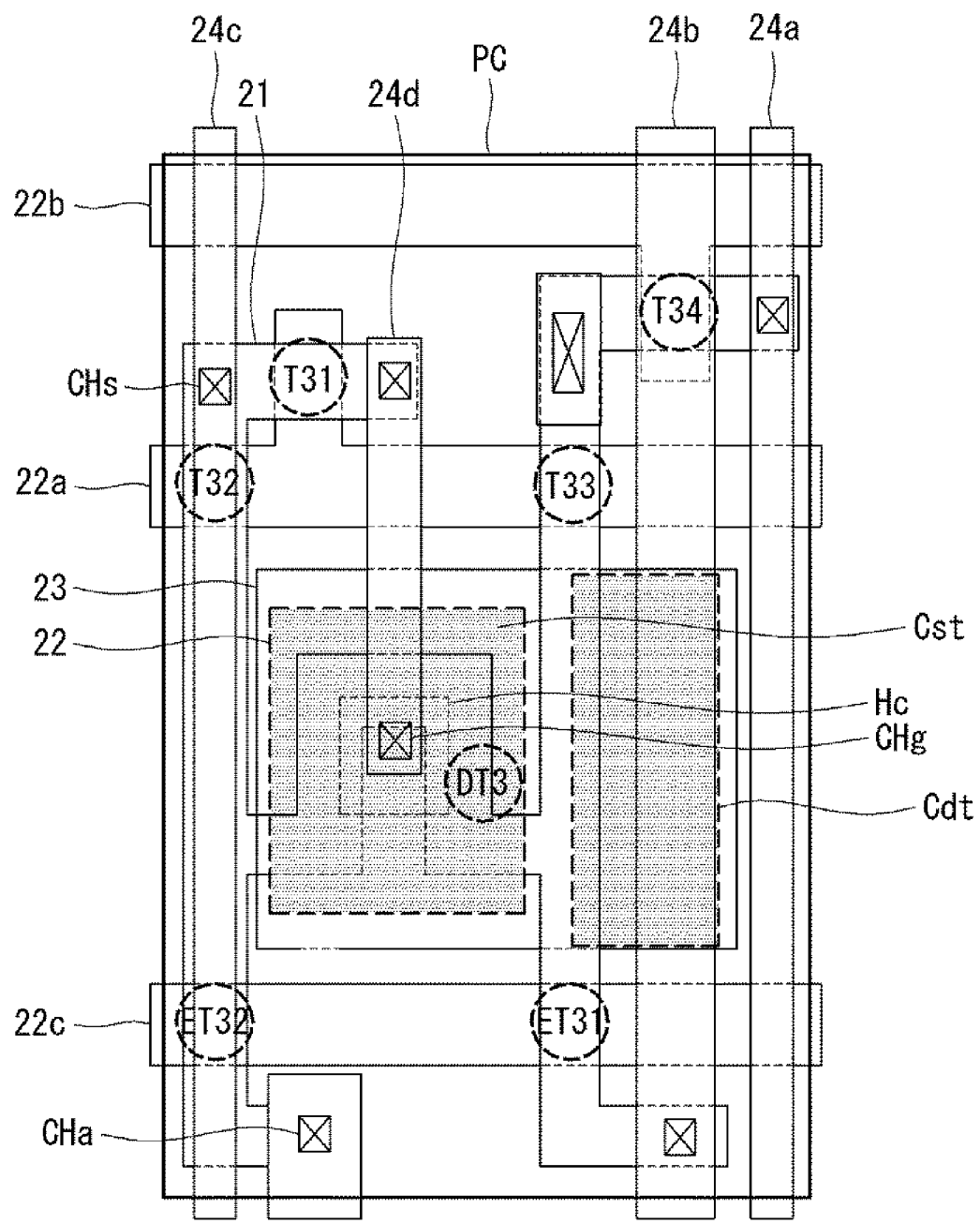
FIG. 8 is a layout diagram of the pixel driving circuit shown in FIG. 7A.

FIG. 8 is a layout diagram of the pixel driving circuit shown in FIG. 7A.

Referring to FIG. 8, a data line 24a, a high potential voltage line 24b, and an initialization voltage line 24c are arranged in the column direction, and a first scan line 22a, a second scan line 22b, and an emission line 22c are arranged in the row direction. Also, an active electrode 21 is connected to and formed integrally with where channels of transistors included in a first switching circuit, a second switching circuit, a driving transistor, and a light emission control circuit should be formed.

The thirty-first transistor T31 and the thirty-second transistor T32 are disposed adjacent to each other, and one electrodes of the thirty-first transistor T31 and the thirty-second transistor T32 are connected to the initialization voltage line 24c through the same contact hole (a source contact hole CHs). The source contact hole CHs may overlap the initialization voltage line 24c such that the initialization voltage line 24c does not have to be branched. The initialization voltage line 24c is formed on the same layer and of the same material as the data line 24a and the high potential voltage line 24b.

The source of the driving transistor DT3 is connected to the high potential voltage line 24b through the first emission transistor ET31, and the drain of the driving transistor DT3 is connected to the anode electrode through an anode contact hole CHa. Also, the gate 22 of the driving transistor DT3 is connected to the other electrode 24d of the thirty-first transistor T31 through a gate contact hole CHg. The twenty-third electrode 23 of the first capacitor Cst forms a hole Hc to surround the gate contact hole CHg so that the other electrode 24d of the thirty-first transistor T31 and the gate 22 of the driving transistor DT3 are brought into contact with each other. The hole Hc formed by the twenty-third electrode 23 may not be short-circuited with the other electrode 24d of the thirty-first transistor T31 and the gate 22 of the driving transistor DT3.

The first capacitor Cst includes a twenty-third electrode 23 and a twenty-second electrode 22, and the twenty-third electrode 23 serves as one electrode of the first capacitor Cst. The twenty-second electrode 22 is located below the twenty-third electrode 23, overlaps the twenty-third electrode 23 to form the first capacitance, and serves as the gate of the driving transistor DT3. The twenty-third electrode 23 is formed to be larger than the twenty-second electrode 22 to overlap the twenty-second electrode 22.

The second capacitor Cdt includes a twenty-fifth electrode and a twenty-sixth electrode. The twenty-fifth electrode is a part where the twenty-third electrode 23 of the first capacitor Cst extends and overlaps the high potential voltage line 24b, and the twenty-sixth electrode is a portion of the high potential voltage line 24b overlapping the twenty-fifth electrode. The second capacitance is formed in an area where the twenty-fifth electrode and the twenty-sixth electrode overlap each other. By expanding the area of the twenty-sixth electrode such that the twenty-sixth electrode does not overlap the twenty-second electrode 22 of the first capacitor Cst in order to increase the second capacitance, compensation performance may be improved, and thus it is possible to implement a high-brightness display panel. The area of the twenty-sixth electrode may be expanded by protruding a portion of the high potential voltage line 24b. The first capacitor Cst and the second capacitor Cdt share the same electrode 23 and form capacitance in different areas of the same electrode 23 while not overlapping each other.

Figure 9A:
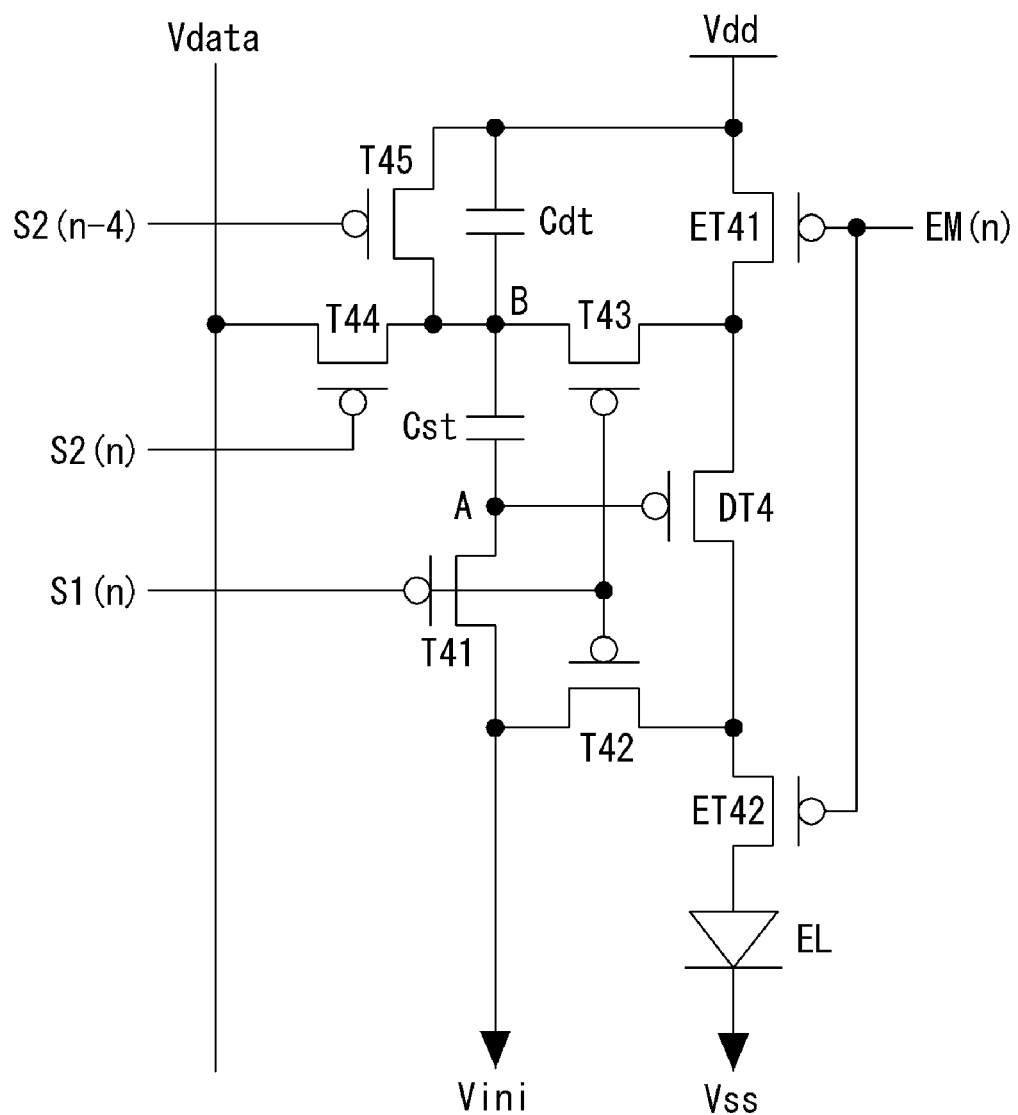

FIGS. 9A and 9B show a pixel driving circuit and a gate signal waveform according to an aspect of the present disclosure. The pixel driving circuit shown in FIG. 9A will be described with regard to the nth subpixel disposed in the nth row of the display area DA. The driving circuit of FIG. 9A is a circuit including all of the elements of FIGS. 6A and 7A, and thus a description overlapping with the foregoing description with reference to FIGS. 6A and 7A will be omitted or simplified.

The pixel driving circuit according to an aspect of the present disclosure is an internal compensation circuit capable of compensating for the threshold voltage of a driving transistor DT4 through the pixel driving circuit.

Power supply voltages such as a high potential voltage Vdd, a low potential voltage Vss, and an initialization voltage Vini and pixel driving signals such as a first scan signal S1(n), a second scan signal S2(n), a second scan signal S2(n−4) applied to an (n−4)$^{th}$ subpixel, an emission signal EM(n), and a data voltage Vdata are applied to the driving circuit.

As an example, the transistors according to an aspect of the present disclosure are implemented as PMOS transistors.

The light-emitting element EL emits light by using the amount of current that is adjusted by the driving transistor DT4 according to the data voltage Vdata, thereby representing brightness corresponding to the data gray level of an input image. The anode of the light-emitting element EL is connected to the light emission control circuit, and the cathode of the light-emitting element EL is connected to a low potential voltage electrode to which the low potential voltage Vss is to be applied.

The driving transistor DT4 is a driving element configured to adjust electric current flowing through the light-emitting element EL according to a gate-source voltage Vgs. The driving transistor DT4 includes a gate connected to a first node A, a source, and a drain.

A first capacitor Cst includes two electrodes for forming first capacitance. One of the two electrodes is connected to the first node A, and the other is connected to a second node B. A second capacitor Cdt includes two electrodes for forming second capacitance. One of the two electrodes is connected to the second node B, and the other is connected to the high potential voltage line.

A first switching circuit of the pixel driving circuit according to an aspect of the present disclosure is turned on by the first scan signal S1(n) to initialize the gate and drain of the driving transistor DT4 and compensate for the threshold voltage of the driving transistor DT4. The first switching circuit includes a forty-first transistor T41, a forty-second transistor T42, and a forty-third transistor T43. Like the preceding aspect, the data voltage Vdata is not used to compensate for the threshold voltage of the driving transistor DT4, and thus the first switching circuit does not include a transistor for applying the data voltage Vdata to the pixel driving circuit.

The forty-first transistor T41 is turned on by the first scan signal S1(n) to provide the initialization voltage Vini to the first node A. The forty-first transistor T41 is connected to the first node A and the initialization voltage line. The leakage current of the forty-first transistor T41, which is connected to the first capacitor Cst, may be reduced by implementing the forty-first transistor T41 as a double-gate transistor. Also, the leakage current of the forty-first transistor T41 may be reduced by increasing a channel length of one of the two transistors constituting the double-gate transistor, which is more closely connected to the first node A, more than a channel length of the other transistor, which is more closely connected to the initialization voltage line.

The forty-second transistor T42 is turned on by the first scan signal S1(n) to provide the initialization voltage Vini to the drain of the driving transistor DT4. The forty-second transistor T42 is connected to the initialization voltage line and the drain of the driving transistor DT4.

The forty-third transistor T43 is turned on by the first scan signal S1(n) to provide the high potential voltage Vdd to the second node B. The forty-third transistor T43 is connected to the second node B and one electrode of the driving transistor DT4. The forty-third transistor T43 may indirectly receive the high potential voltage Vdd through another transistor.

A second switching circuit of the pixel driving circuit according to an aspect of the present disclosure may be turned on by a second scan signal S2(n) to apply the data voltage Vdata to the second node B. Thus, electric current corresponding to the data voltage Vdata may be generated from the driving transistor DT4. The second switching circuit includes a forty-fourth transistor T44.

The forty-fourth transistor T44 is turned on by the second scan signal S2(n) to provide the data voltage Vdata to the second node B. The forty-fourth transistor T44 is connected to the second node B and the data voltage line.

The first scan signal S1(n) and the second scan signal S2(n) are provided to the first switching circuit and the second switching circuit through different scan driving circuits, respectively.

The driving circuit according to an aspect of the present disclosure is turned on by the second scan signal S2(n-4) applied to the (n-4)th subpixel to apply the high potential voltage Vdd to the second node B by including a third switching circuit. The third switching circuit prevents the high potential voltage line from being short-circuited with the initialization voltage line and the low potential voltage electrode during the initialization period. The third switching circuit includes a forty-fifth transistor T45.

The forty-fifth transistor T45 is turned on by the second scan signal S2(n-4) applied to the (n-4)th subpixel to provide the high potential voltage Vdd to the second node B. The forty-fifth transistor T45 is connected to the second node B and the high potential voltage line.

A light emission control circuit of the driving circuit according to an aspect of the present disclosure is turned on by the emission signal EM(n) to provide the high potential voltage Vdd to the driving transistor DT4. Thus, the driving transistor DT4 is turned on to generate the driving current Ioled and form a current path between the driving transistor DT4 and the light-emitting element EL. The light emission control circuit includes a first emission transistor ET41 and a second emission transistor ET42.

The first emission transistor ET41 is turned on by the emission signal EM(n) to provide the high potential voltage Vdd to the driving transistor DT4. The first emission transistor ET41 is connected to the high potential voltage line and the source of the driving transistor DT4.

The second emission transistor ET42 is turned on by the emission signal EM(n) to provide the driving current generated by the driving transistor DT4 to the anode of the light-emitting element EL. When the second emission transistor ET42 is additionally included, resistance increases compared to a structure with only the first emission transistor ET41. Thus, current that may flow to the light-emitting element EL during the initialization period may be further decreased. Therefore, since the black screen becomes darker, it is possible to improve the contrast ratio of the display panel. Also, the anode of the light-emitting element EL is discharged with the initialization voltage during the initialization period.

Referring to FIG. 9B, prior to the first scan signal S1(n), the second scan signal S2(n-4) applied to the (n-4)th subpixel is supplied to the nth subpixel. Following the first scan signal S1(n), the second scan signal S2(n) synchronized with the data voltage Vdata is supplied to the nth subpixel. The driving of the subpixel may be divided into an initialization period ①, a sampling period ②, a programming period ③, and an emission period ④.

The initialization period ① is one horizontal period 1H, and the emission signal EM(n) and the second scan signal S2(n-4) applied to the (n-4)th subpixel are on-level pulses during the initialization period ①. The forty-fifth transistor T45 is turned on by the second scan signal S2(n-4) applied to the (n-4)th subpixel to apply the high potential voltage Vdd to the second node B. Also, the first emission transistor ET41 is turned on by the emission signal EM(n) to apply the high potential voltage Vdd to the source of the driving transistor DT4. During the initialization period ①, the source of the driving transistor DT4 and the second node B are set to the high potential voltage Vdd.

The sampling period ② is shown as having three horizontal periods 3H. However, the present disclosure is not limited thereto. The sampling period ② may be adjusted by the first scan signal S1(n). During the sampling period ②, the first scan signal S1(n) remains as an on-level pulse, and the emission signal EM(n) switches to an off-level pulse. During the sampling period ②, the first switching circuits T41, T42, and T43, which have been turned on, discharge the gate and drain of the driving transistor DT4 by using the initialization voltage Vini and turn on the driving transistor DT4 to sense the threshold voltage of the driving transistor DT4. In this case, the initialization voltage Vini is applied to the first node A, and the sum of the initialization voltage Vini and the threshold voltage of the driving transistor DT4 is applied to the second node B. Accordingly, the threshold voltage value of the driving transistor DT4 is stored in the second node B.

In the case of the driving circuit according to an aspect of the present disclosure, the sampling period ② is set to three horizontal periods 3H. However, the present disclosure is not limited thereto. By implementing the driving circuit such that the data voltage Vdata is not used to compensate for the threshold voltage of the driving transistor DT4, the sampling period ② may be secured to be greater than or equal to one horizontal period 1H.

By using a separate signal to control a circuit for applying the data voltage Vdata separately from a circuit for compensating for the threshold voltage of the driving transistor DT4, the pixel driving circuit according to an aspect of the present disclosure may sufficiently secure the sampling period ② to exceed one horizontal period 1H and thus may accurately compensate for the threshold voltage of the driving transistor DT4. Also, even though the resolution and frequency of the display panel 101 increase, sufficient compensation time may be secured, and sampling time ② may be adjusted according to the resolution and frequency of the display panel 101.

The programming period ③ is one horizontal period 1H, and the second scan signal S2(n) is an on-level pulse during the programming period ③. The first switching circuits T41, T42, and T43, the driving transistor DT4, and the light emission control circuits ET41 and ET42 are turned off. The forty-fourth transistor T44 is turned on by the second scan signal S2(n) to apply the data voltage Vdata to the second node B, and the difference between the threshold voltage of the driving transistor DT4 and the data voltage Vdata is applied to the first node A due to the coupling effect of the first capacitor Cst. Also, the high potential voltage Vdd and the data voltage Vdata are applied to the two electrodes forming the second capacitor Cdt. Since the second capacitor Cdt is disposed between and connected to the first capacitor Cst and the high potential voltage line without directly connecting the first capacitor Cst to the high potential voltage line, the data voltage Vdata may be applied to the second node B.

During the emission period ④, the emission signal EM(n) is an on-level pulse, and the second scan signal S2(n) is an off-level pulse. The emission signal EM(n) maintains an off-level pulse during about four horizontal periods 4H in which the emission signal EM(n) overlaps the first scan signal S1(n) and the second scan signal S2(n).

During the emission period ④, the light emission control circuits ET41 and ET42 are turned on to electrically connect the high potential voltage Vdd to the source of the driving transistor DT4, and the driving transistor DT4 is turned on to provide the driving current Ioled to the light-emitting element EL. The driving current Ioled corresponds to Equation 1. Referring to Equation 1, since the threshold voltage value of the driving transistor is removed from the driving current Ioled, the driving current Ioled does not depend on the threshold voltage of the driving transistor and is not affected even by the change of the threshold voltage.

The first capacitor Cst may constantly provide the driving current Ioled to the light-emitting element EL by maintaining a constant voltage applied to the gate of the driving transistor DT4 during the emission period ④.

Figure 10A:
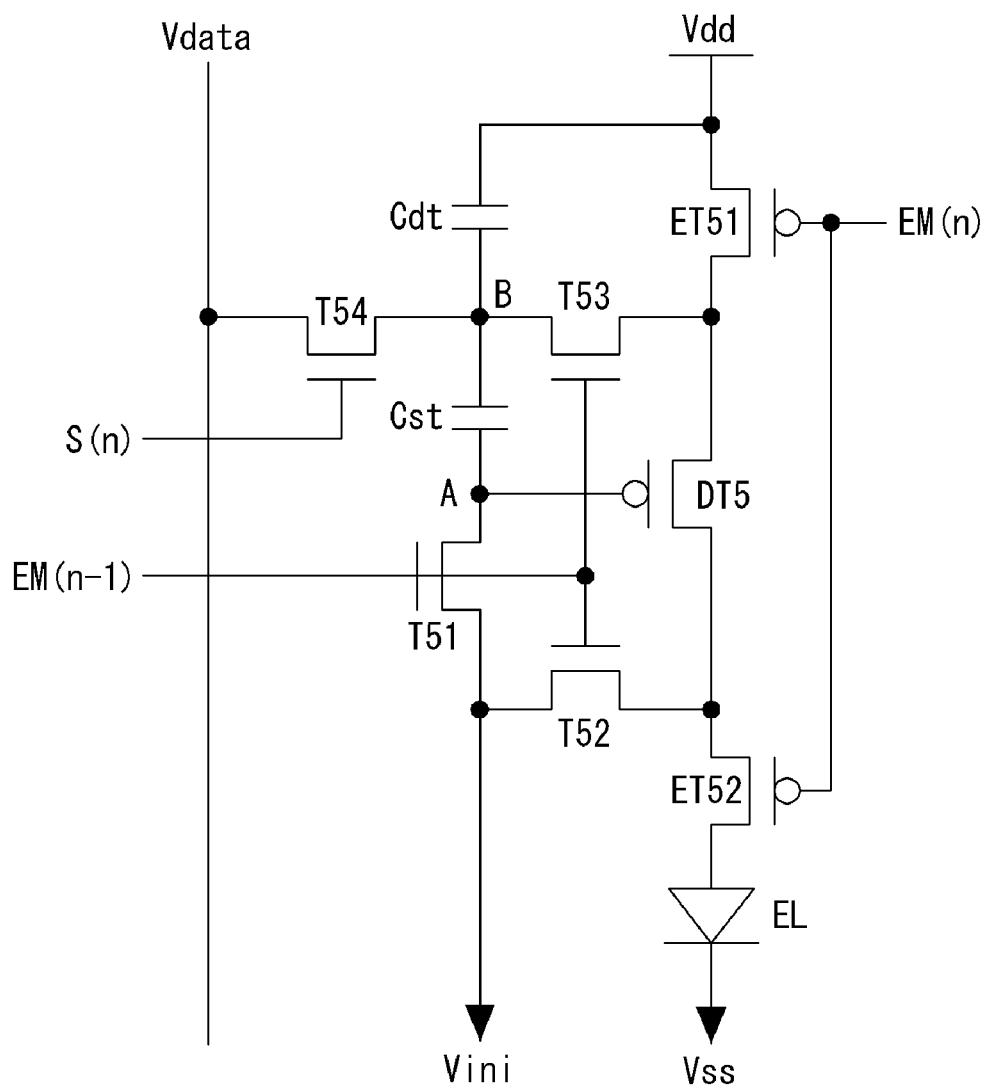

FIGS. 10A and 10B show a pixel driving circuit and a gate signal waveform according to an aspect of the present disclosure. The pixel driving circuit shown in FIG. 10A will be described with regard to the nth subpixel disposed in the nth row of the display area DA. The driving circuit of FIG. 10A is a circuit in which some transistors included in the pixel driving circuit of FIG. 7A are implemented as n-type metal oxide semiconductor (NMOS) transistors, and thus a description overlapping with the foregoing description with reference to FIG. 7A will be omitted or simplified.

The pixel driving circuit according to an aspect of the present disclosure is an internal compensation circuit capable of compensating for the threshold voltage of a driving transistor DT5 through the pixel driving circuit.

Power supply voltages such as a high potential voltage Vdd, a low potential voltage Vss, and an initialization voltage Vini and pixel driving signals such as a scan signal S(n), an emission signal applied to an (n−1)th subpixel, an emission signal EM(n), and a data voltage Vdata are applied to the pixel driving circuit.

As an example, the transistors according to an aspect of the present disclosure are implemented as NMOS transistors and PMOS transistors. The turn-on voltage of the NMOS transistor is a gate high voltage, and the turn-off voltage of the NMOS transistor is a gate low voltage. The turn-on voltage of the PMOS transistor is a gate low voltage, and the turn-off voltage of the PMOS transistor is a gate high voltage.

The light-emitting element EL emits light by using the amount of current that is adjusted by the driving transistor DT5 according to the data voltage Vdata, thereby representing brightness corresponding to the data gray level of an input image. The anode of the light-emitting element EL is connected to the light emission control circuit, and the cathode of the light-emitting element EL is connected to a low potential voltage electrode to which the low potential voltage Vss is to be applied.

The driving transistor DT5 is a driving element configured to adjust electric current flowing through the light-emitting element EL according to a gate-source voltage Vgs. The driving transistor DT5 is implemented as a PMOS transistor and includes a gate connected to a first node A, a source, and a drain.

A first capacitor Cst includes two electrodes for forming first capacitance. One of the two electrodes is connected to the first node A, and the other is connected to a second node B. A second capacitor Cdt includes two electrodes for forming second capacitance. One of the two electrodes is connected to the second node B, and the other is connected to the high potential voltage line.

A first switching circuit of the pixel driving circuit according to an aspect of the present disclosure is turned on by the emission signal EM(n−1) applied to the (n−1)th subpixel to initialize the gate and drain of the driving transistor DT5 and compensate for the threshold voltage of the driving transistor DT5. The first switching circuit includes a fifty-first transistor T51, a fifty-second transistor T52, and a fifty-third transistor T53 which are implemented as NMOS transistors. Like the preceding aspect, in order for the data voltage Vdata not to be used to compensate for the threshold voltage of the driving transistor DT5, the first switching circuit does not include a transistor for applying the data voltage Vdata to the pixel driving circuit.

The fifty-first transistor T51 is turned on by the emission signal EM(n−1) applied to the (n−1)th subpixel to provide the initialization voltage Vini to the first node A. The fifty-first transistor T51 is connected to the first node A and the initialization voltage line. The leakage current of the fifty-first transistor T51, which is connected to the first capacitor Cst, may be reduced by implementing the fifty-first transistor T51 as a double-gate transistor. Also, the leakage current of the fifty-first transistor T51 may be reduced by increasing a channel length of one of the two transistors constituting the double-gate transistor, which is more closely connected to the first node A, more than a channel length of the other transistor, which is more closely connected to the initialization voltage line.

The fifty-second transistor T52 is turned on by the emission signal EM(n−1) applied to the (n−1)th subpixel to provide the initialization voltage Vini to the drain of the driving transistor DT5. The fifty-second transistor T52 is connected to the initialization voltage line and the drain of the driving transistor DT5.

The fifty-third transistor T53 is turned on by the emission signal EM(n−1) applied to the (n−1)th subpixel to provide the high potential voltage Vdd to the second node B. The fifty-third transistor T53 is connected to the second node B and the source of the driving transistor DT5. The fifty-third transistor T53 may indirectly receive the high potential voltage Vdd through another transistor.

A second switching circuit of the pixel driving circuit according to an aspect of the present disclosure may be turned on by the scan signal S(n) to apply the data voltage Vdata to the second node B. Thus, electric current corresponding to the data voltage Vdata may be generated from the driving transistor DT5. The second switching circuit includes a fifty-fourth transistor T54 which is implemented as an NMOS transistor.

The fifty-fourth transistor T54 is turned on by the scan signal S(n) to provide the data voltage Vdata to the second node B. The fifty-fourth transistor T54 is connected to the second node B and the data voltage line.

A light emission control circuit of the pixel driving circuit according to an aspect of the present disclosure is turned on by the emission signal EM(n) to provide the high potential voltage Vdd to the driving transistor DT5. Thus, the driving transistor DT5 is turned on to generate the driving current Ioled and form a current path between the driving transistor DT5 and the light-emitting element EL. The light emission control circuit includes a first emission transistor ET51 and a second emission transistor ET52 which are implemented as PMOS transistors.

The first emission transistor ET51 is turned on by the emission signal EM(n) to provide the high potential voltage Vdd to the driving transistor DT5. The first emission transistor ET51 is connected to the high potential voltage line and the source of the driving transistor DT5.

The second emission transistor ET52 is turned on by the emission signal EM(n) to provide the driving current generated by the driving transistor DT5 to the anode of the light-emitting element EL. When the second emission transistor ET52 is additionally included, resistance increases compared to a structure with only the first emission transistor ET51. Thus, current that may flow to the light-emitting element EL during the initialization period may be further decreased. Therefore, since the black screen becomes darker, it is possible to improve the contrast ratio of the display panel. Also, the anode of the light-emitting element EL is discharged with the initialization voltage during the initialization period.

Figure 11A:
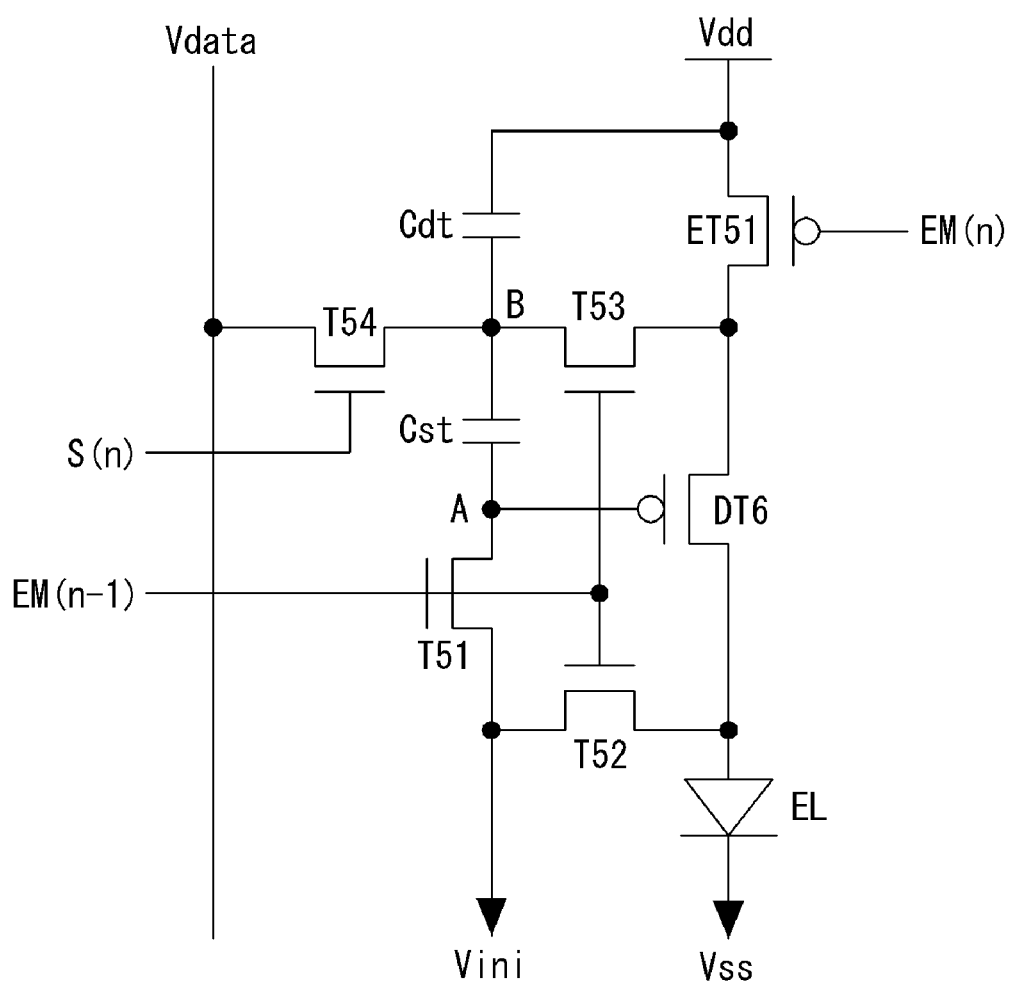
FIGS. 11A and 11B show a pixel driving circuit and a gate signal waveform according to an aspect of the present disclosure.
Figure 11B:
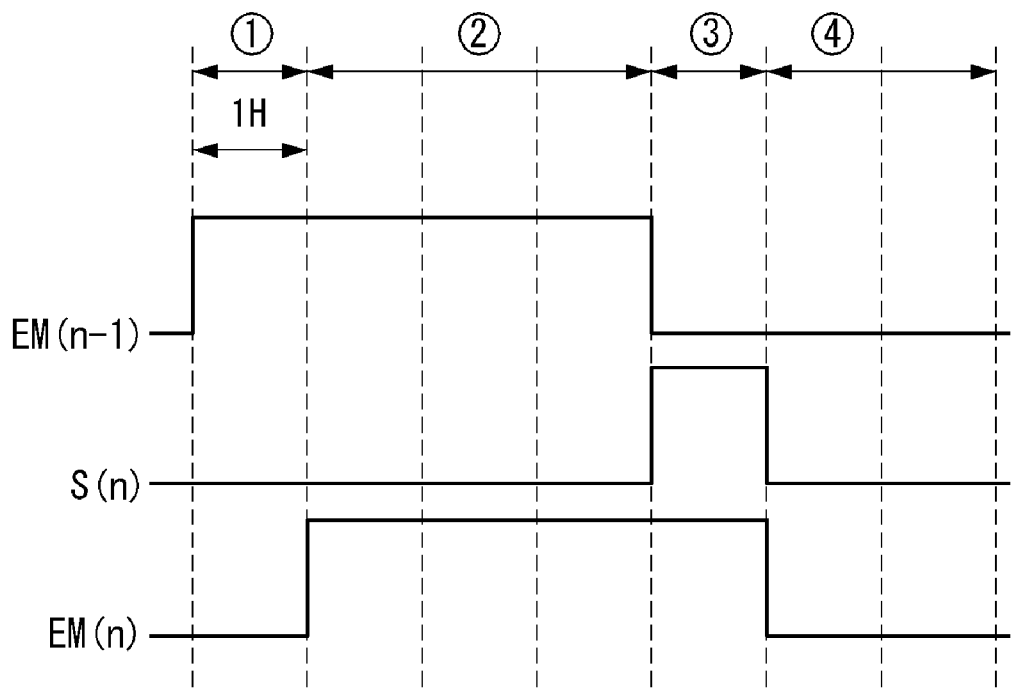

Like the driving circuit shown in FIG. 11A, the second emission transistor ET52 may be omitted. FIG. 11B is a waveform chart of a gate signal of the driving circuit of FIG. 11A. Even when the second emission transistor ET52 is omitted, the driving circuit may operate with the same gate signal waveform as that shown in FIG. 10B.

Referring to FIG. 10B, following the emission signal EM(n−1) applied to the (n−1) the subpixel, the scan signal S2(n) synchronized with the data voltage Vdata is supplied to the nth subpixel. The driving of the subpixel may be divided into an initialization period ①, a sampling period ②, a programming period ③, and a emission period ④.

The initialization period ① and the programming period ③ have one horizontal period 1H, and the sampling period ② has three horizontal periods 3H. The sampling period ② may be controlled by the emission signal EM(n−1) applied to the (n−1)th subpixel such that the horizontal periods are adjusted. The emission signal EM(n−1) applied to the (n−1) th subpixel is an on-level pulse during the initialization period ① and the sampling period ② and is an off-level pulse during the programming period ③ and the emission period ④. The scan signal S(n) is an on-level pulse during the programming period ③ and is an off-level pulse during the initialization period ①, the sampling period ②, and the emission period ④. The emission signal EM(n) is an on-level pulse during the initialization period ① and the emission period ④ and is an off-level pulse during the sampling period ② and the programming period ③. The emission signal EM(n) maintains an off-level pulse during about four horizontal periods 4H in which the emission signal EM(n) overlaps the scan signal S(n) and the emission signal EM(n−1) applied to the (n−1)th subpixel.

In this case, the on-level pulse of the emission signal EM(n−1) applied to the (n−1)th subpixel, which is applied to the first switching circuit, is a gate high voltage, and the off-level pulse of the emission signal EM(n−1) is a gate low voltage. The on-level pulse of the scan signal S(n), which is applied to the second switching circuit, is a gate high voltage, and the off-level pulse of the scan signal S(n) is a gate low voltage. The on-level pulse of the emission signal EM(n), which is applied to the light emission control circuit, is a gate low voltage, and the off-level pulse of the emission signal EM(n) is a gate high voltage.

The first switching circuits T51, T52, and T53, the driving transistor DT5, and the light emission control circuits ET51 and ET52 are turned on during the initialization period ①. As a result, the first node A and the initialization voltage line are electrically connected to each other, the anode and the initialization voltage line are electrically connected to each other, and the second node B and the high potential voltage line are electrically connected to each other.

During the sampling period ②, the first switching circuits T51, T52, and T53 and the driving transistor DT5 are turned on. Also, the light emission control circuits ET51 and ET52 are turned off. Thus, the voltage of the second node B gradually decreases and converges to the sum of the initialization voltage Vini and the threshold voltage of the driving transistor DT5. Accordingly, the threshold voltage value of the driving transistor DT5 is stored in the second node B.

In the case of the driving circuit according to an aspect of the present disclosure, the sampling period ② is set to three horizontal periods 3H. However, the present disclosure is not limited thereto. By implementing the pixel driving circuit so that the data voltage Vdata is not used to compensate for the threshold voltage of the driving transistor DT5, the sampling period ② may be secured to be greater than or equal to one horizontal period 1H.

By using a separate signal to control a circuit for applying the data voltage Vdata separately from a circuit for compensating for the threshold voltage of the driving transistor DT5, the pixel driving circuit according to an aspect of the present disclosure may sufficiently secure the sampling period ② to exceed one horizontal period 1H and thus may accurately compensate for the threshold voltage of the driving transistor DT5. Also, even though the resolution and frequency of the display panel 101 increase, sufficient compensation time may be secured, and sampling time ② may be adjusted according to the resolution and frequency of the display panel 101.

During the programming period ③, the second switching circuit T54 is turned on to electrically connect the data voltage line to the second node B. The first switching circuits T51, T52, and T53, the driving transistor DT5, and the light emission control circuits ET51 and ET52 are turned off. In this case, the data voltage Vdata is applied to the second node B, and the difference between the data voltage Vdata and the threshold voltage of the driving transistor DT5 is applied to the first node A due to the coupling effect of the first capacitor Cst. Also, the high potential voltage Vdd and the data voltage Vdata are applied to the two electrodes forming the second capacitor Cdt. Since the second capacitor Cdt is disposed between and connected to the first capacitor Cst and the high potential voltage line without directly connecting the first capacitor Cst to the high potential voltage line, the data voltage Vdata may be applied to the second node B.

During the emission period ④, the light emission control circuits ET51 and ET52 are turned on to electrically connect the high potential voltage Vdd to the source of the driving transistor DT5, and the driving transistor DT5 is turned on to provide the driving current Ioled to the light-emitting element EL. The driving current Ioled corresponds to Equation 1. Referring to Equation 1, since the threshold voltage value of the driving transistor is removed from the driving current Ioled, the driving current Ioled does not depend on the threshold voltage of the driving transistor and is not affected even by the change of the threshold voltage.

The first capacitor Cst may constantly provide the driving current Ioled to the light-emitting element EL by maintaining a constant voltage applied to the gate of the driving transistor DT5 during the emission period ④.

Figure 12A:
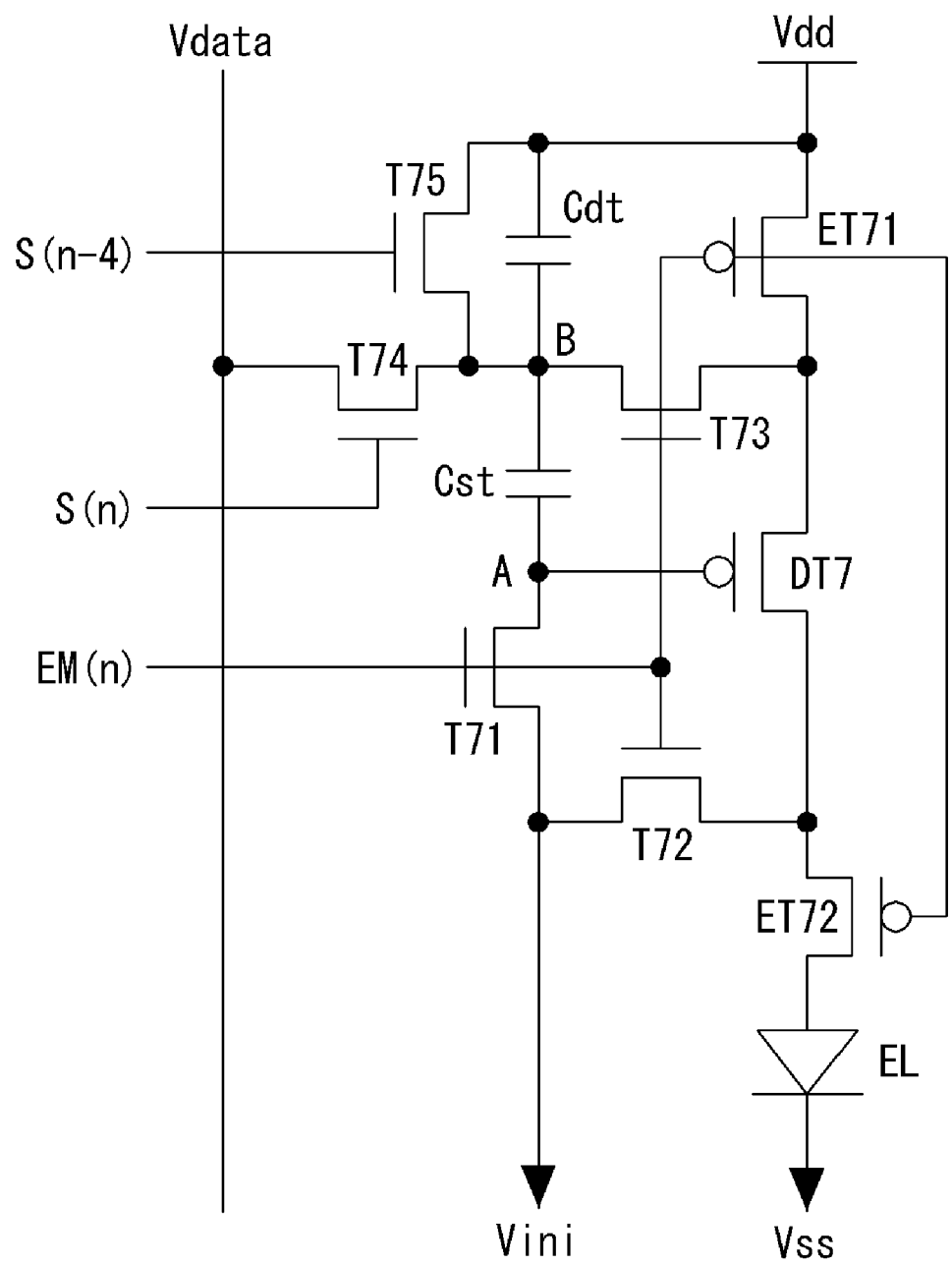
FIGS. 12A and 12B show a pixel driving circuit and a gate signal waveform according to an aspect of the present disclosure.
Figure 12B:
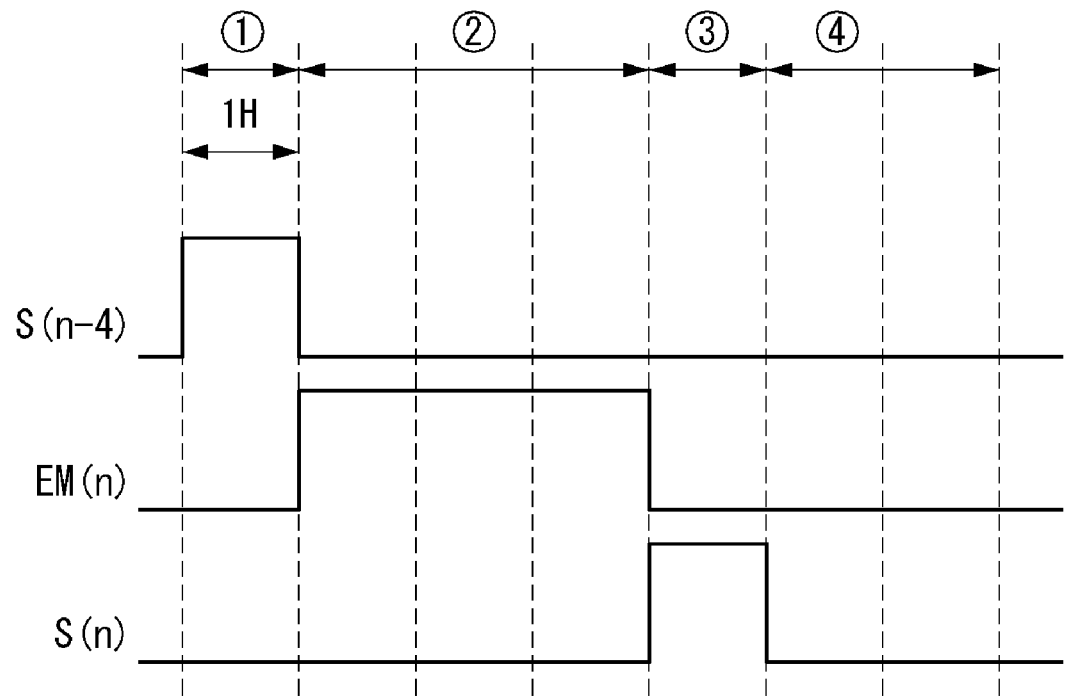

FIGS. 12A and 12B show a pixel driving circuit and a gate signal waveform according to an aspect of the present disclosure. The pixel driving circuit shown in FIG. 12A will be described with regard to the nth subpixel disposed in the nth row of the display area DA. The pixel driving circuit of FIG. 12A is a circuit in which some transistors included in the pixel driving circuit of FIG. 9A are implemented as NMOS transistors, and thus a description overlapping with the foregoing description with reference to FIG. 9A will be omitted or simplified.

The pixel driving circuit according to an aspect of the present disclosure is an internal compensation circuit capable of compensating for the threshold voltage of a driving transistor DT7 through the pixel driving circuit.

Power supply voltages, such as a high potential voltage Vdd, a low potential voltage Vss, and an initialization voltage Vini, and pixel driving signals, such as a scan signal S(n), a scan signal S(n−4) applied to an (n−1)th subpixel, an emission signal EM(n), and a data voltage Vdata, are applied to the pixel driving circuit.

The scan signals S(n) and S(n−4) and the emission signal EM(n) have a gate low voltage or a gate high voltage at regular time intervals. As an example, the transistors according to an aspect of the present disclosure are implemented as NMOS transistors and PMOS transistors.

The light-emitting element EL emits light by using the amount of current that is adjusted by the driving transistor DT7 according to the data voltage Vdata, thereby representing brightness corresponding to the data gray level of an input image. The anode of the light-emitting element EL is connected to the light emission control circuit, and the cathode of the light-emitting element EL is connected to a low potential voltage electrode to which the low potential voltage Vss is to be applied.

The driving transistor DT7 is a driving element configured to adjust electric current flowing through the light-emitting element EL according to a gate-source voltage Vgs. The driving transistor DT5 is implemented as a PMOS transistor and includes a gate connected to a first node A, a source, and a drain.

A first capacitor Cst includes two electrodes for forming first capacitance. One of the two electrodes is connected to the first node A, and the other is connected to a second node B. A second capacitor Cdt includes two electrodes for forming second capacitance. One of the two electrodes is connected to the second node B, and the other is connected to the high potential voltage line.

A first switching circuit of the pixel driving circuit according to an aspect of the present disclosure is turned on by the emission signal EM(n) to initialize the gate and drain of the driving transistor DT7 and compensate for the threshold voltage of the driving transistor DT7. The first switching circuit includes a seventy-first transistor T71, a seventy-second transistor T72, and a seventy-third transistor T73 which are implemented as NMOS transistors. Like the preceding aspect, in order for the data voltage Vdata not to be used to compensate for the threshold voltage of the driving transistor DT7, the first switching circuit does not include a transistor for applying the data voltage Vdata to the pixel driving circuit.

The seventy-first transistor T71 is turned on by the emission signal EM(n) to provide the initialization voltage Vini to the first node A. The seventy-first transistor T71 is connected to the first node A and the initialization voltage line. The leakage current of the seventy-first transistor T71, which is connected to the first capacitor Cst, may be reduced by implementing the seventy-first transistor T71 as a double-gate transistor. Also, the leakage current of the seventy-first transistor T71 may be reduced by increasing a channel length of one of the two transistors constituting the double-gate transistor, which is more closely connected to the first node A, more than a channel length of the other transistor, which is more closely connected to the initialization voltage line.

The seventy-second transistor T72 is turned on by the emission signal EM(n) to provide the initialization voltage Vini to the anode of the light-emitting element EL. The seventy-second transistor T72 is connected to the initialization voltage line and the drain of the driving transistor DT7.

The seventy-third transistor T73 is turned on by the emission signal EM(n) to provide the high potential voltage Vdd to the second node B. The seventy-third transistor T73 is connected to the second node B and the source of the driving transistor DT7. The seventy-third transistor T73 may indirectly receive the high potential voltage Vdd through another transistor.

A second switching circuit of the pixel driving circuit according to an aspect of the present disclosure may be turned on by the scan signal S(n) to apply the data voltage Vdata to the second node B. Thus, electric current corresponding to the data voltage Vdata may be generated from the driving transistor DT7. The second switching circuit includes a seventy-fourth transistor T74 which is implemented as an NMOS transistor.

The seventy-fourth transistor T74 is turned on by the scan signal S(n) to provide the data voltage Vdata to the second node B. The seventy-fourth transistor T74 is connected to the second node B and the data voltage line.

The pixel driving circuit according to an aspect of the present disclosure is turned on by the scan signal S(n−4) applied to the (n−4)th subpixel to apply the high potential voltage Vdd to the second node B. The third switching circuit prevents the high potential voltage line from being short-circuited with the initialization voltage line and the low potential voltage electrode during the initialization period. The third switching circuit includes a seventy-fifth transistor T75 which is implemented as an NMOS transistor.

The seventy-fifth transistor T75 is turned on by the scan signal S(n−4) applied to the (n−4)th subpixel to provide the high potential voltage Vdd to the second node B. The seventy-fifth transistor T75 is connected to the second node B and the high potential voltage line.

A light emission control circuit of the pixel driving circuit according to an aspect of the present disclosure is turned on by the emission signal EM(n) to provide the high potential voltage Vdd to the driving transistor DT7. Thus, the driving transistor DT7 is turned on to generate the driving current Ioled and form a current path between the driving transistor DT7 and the light-emitting element EL. The light emission control circuit includes a first emission transistor ET71 and a second emission transistor ET72 which are implemented as PMOS transistors.

The first emission transistor ET71 is turned on by the emission signal EM(n) to provide the high potential voltage Vdd to the driving transistor DT7. The emission transistor ET71 is connected to the high potential voltage line and the source of the driving transistor DT7.

The second emission transistor ET72 is turned on by the emission signal EM(n) to provide the driving current generated by the driving transistor DT7 to the anode of the light-emitting element EL. When the second emission transistor ET72 is additionally included, resistance increases compared to a structure with only the first emission transistor ET71. Thus, current that may flow to the light-emitting element EL during the initialization period may be further decreased. Therefore, since the black screen becomes darker, it is possible to improve the contrast ratio of the display panel. Also, the anode of the light-emitting element EL is discharged with the initialization voltage during the initialization period.

Figure 13A:
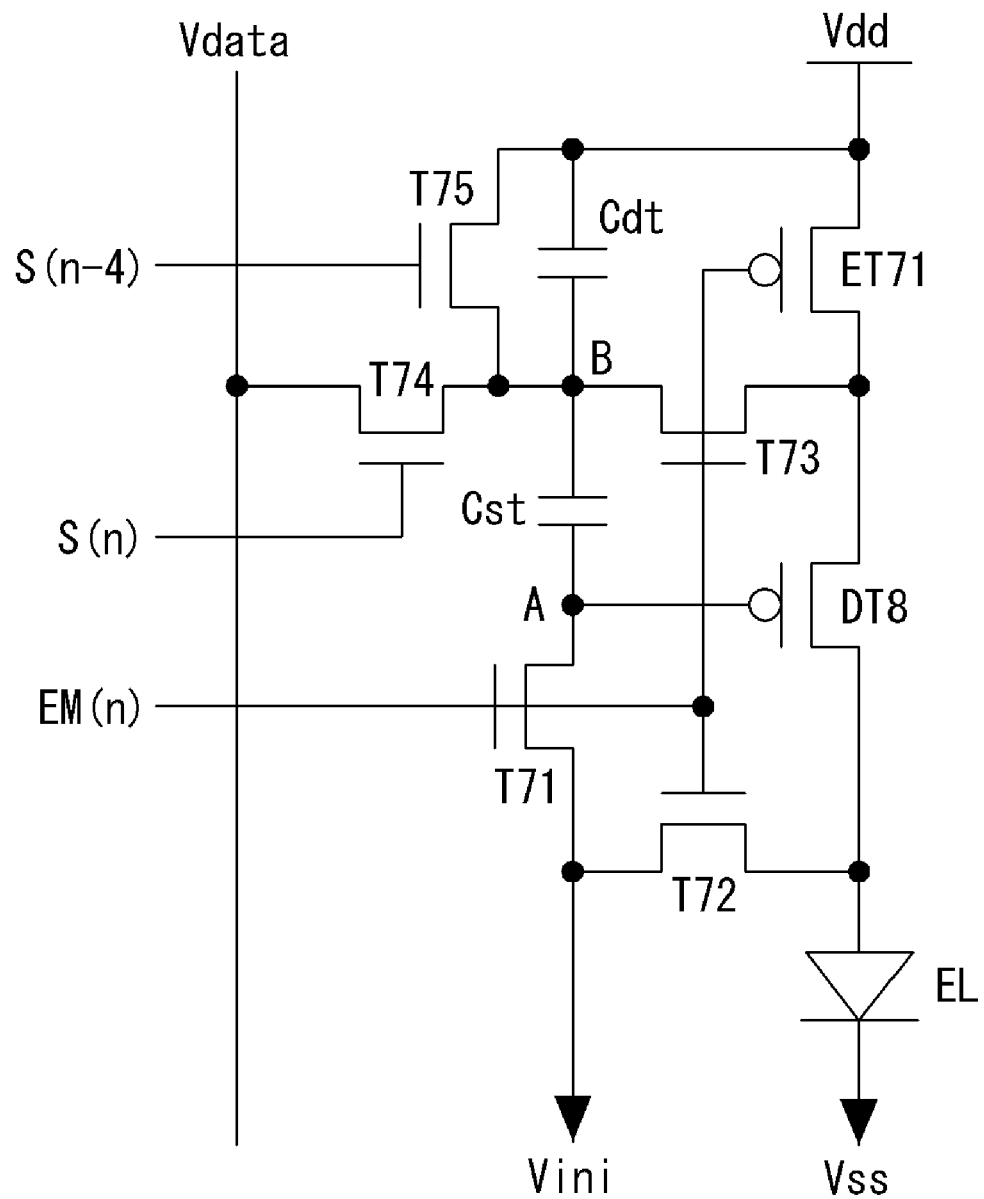
FIGS. 13A and 13B show a pixel driving circuit and a gate signal waveform according to an aspect of the present disclosure.
Figure 13B:
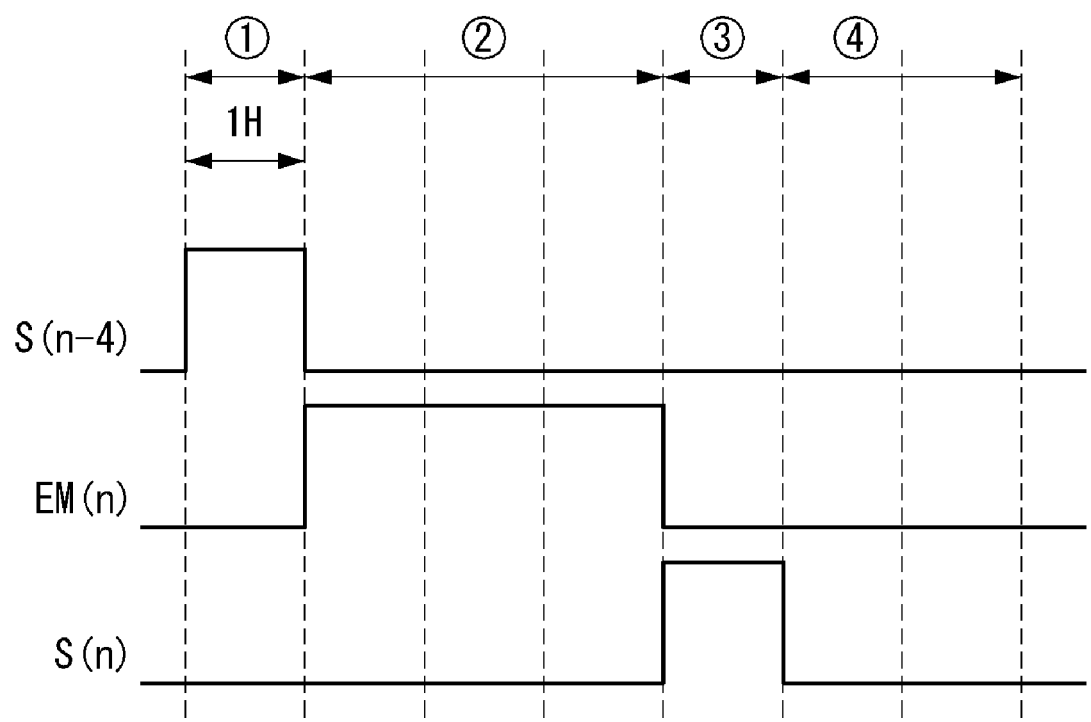

Like the pixel driving circuit shown in FIG. 13A, the second emission transistor ET72 may be omitted. FIG. 13B is a waveform chart of a gate signal of the driving circuit of FIG. 13A. Even when the second emission transistor ET72 is omitted, the driving circuit may operate with the same gate signal waveform as that shown in FIG. 12B.

Referring to FIG. 12B, the driving of the subpixel may be divided into an initialization period ①, a sampling period ②, a programming period ③, and a emission period ④. The initialization period ① and the programming period ③ have one horizontal period 1H, and the sampling period ② has three horizontal periods 3H. The sampling period ② may be controlled by the emission signal EM(n) such that the horizontal periods are adjusted. The scan signal S(n−4) applied to the (n−4)th subpixel remains as an on-level pulse during the initialization period ① and remains as an off-level pulse during the other periods. The emission signal EM(n) remains as a gate high voltage during the sampling period ② and remains as a gate low voltage during the other periods. The scan signal S(n) remains as an on-level pulse during the programming period ③ and remains as the off-level pulse during the other periods.

In this case, the gate high voltage of the emission signal EM(n) is an on-level pulse when the gate high voltage is applied to the first switching circuit and is an off-level pulse when the gate high voltage is applied to the light emission control circuit. The on-level pulse of the scan signal S(n), which is applied to the second switching circuit, is a gate high voltage, and the off-level pulse of the scan signal S(n) is a gate low voltage. The on-level pulse of the scan signal S(n−4), which is applied to the (n−4)th subpixel, is a gate high voltage, and the off-level pulse of the scan signal S(n−4) is a gate low voltage.

Since the scan signal S(n−4) applied to the (n−4)th subpixel during the initialization period ① is a gate high voltage, the third switching circuit is turned on. Since the emission signal EM(n) is a gate low voltage, the light emission control circuit is turned on. The seventy-fifth transistor T75 is turned on by the scan signal S(n−4) applied to the (n−4)th subpixel to apply the high potential voltage Vdd to the second node B. Also, the emission transistors ET71 and ET72 are turned on by the emission signal EM(n) to apply the high potential voltage Vdd to the source of the driving transistor DT7. During the initialization period ①, the source of the driving transistor DT7 and the second node B are set to the high potential voltage Vdd.

In this case, the circuit controlled by the emission signal EM(n) includes the first switching circuit and the light emission control circuit. Since the first switching circuit is implemented using NMOS transistors and the light emission control circuit is implemented using PMOS transistors, the light emission control circuit is turned off when the first switching circuit is turned on, and is turned on when the first switching circuit is turned off. Accordingly, the first switching circuit and the light emission control circuit may be controlled through one gate driving circuit, and thus the size of the gate driving circuit may be reduced.

The sampling period ② is shown as having three horizontal periods 3H. However, the present disclosure is not limited thereto. The sampling period ② may be adjusted by the emission signal EM(n), and the gate high voltage is maintained during the sampling period ②. During the sampling period ②, the first switching circuits T71, T72, and T73, which have been turned on, discharge the gate and drain of the driving transistor DT7 by using the initialization voltage Vini and turn on the driving transistor DT7 to sense the threshold voltage of the driving transistor DT7. In this case, the initialization voltage Vini is applied to the first node A, and the sum of the initialization voltage Vini and the threshold voltage of the driving transistor DT7 is applied to the second node B. Accordingly, the threshold voltage value of the driving transistor DT7 is stored in the second node B.

In the case of the pixel driving circuit according to an aspect of the present disclosure, the sampling period ② is set to three horizontal periods 3H. However, the present disclosure is not limited thereto. By implementing the pixel driving circuit such that the data voltage Vdata is not used to compensate for the threshold voltage of the driving transistor DT7, the sampling period ② may be secured to be greater than or equal to one horizontal period 1H.

By using a separate signal to control a circuit for controlling whether to apply the data voltage Vdata separately from a circuit for compensating for the threshold voltage of the driving transistor DT7, the pixel driving circuit according to an aspect of the present disclosure may sufficiently secure the sampling period ② to exceed one horizontal period 1H and thus may accurately compensate for the threshold voltage of the driving transistor DT7. Also, even though the resolution and frequency of the display panel 101 increase, sufficient compensation time may be secured, and sampling time ② may be adjusted according to the resolution and frequency of the display panel 101.

The programming period ③ is one horizontal period 1H, and the second scan signal S2(n) is an on-level pulse during the programming period ③. The first switching circuits T71, T72, and T73, the driving transistor DT7, and the light emission control circuits ET71 and ET72 are turned off. The seventy-fourth transistor T74 is turned on by the scan signal S(n) to apply the data voltage Vdata to the second node B, and the difference between the threshold voltage of the driving transistor DT7 and the data voltage Vdata is applied to the first node A due to the coupling effect of the first capacitor Cst. Also, the high potential voltage Vdd and the data voltage Vdata are applied to the two electrodes forming the second capacitor Cdt. Since the second capacitor Cdt is disposed between and connected to the first capacitor Cst and the high potential voltage line without directly connecting the first capacitor Cst to the high potential voltage line, the data voltage Vdata may be applied to the second node B.

During the emission period ④, the emission signal EM(n) maintains a gate low voltage. During the emission period ④, the light emission control circuits ET71 and ET72 are turned on to electrically connect the high potential voltage Vdd to the source of the driving transistor DT7, and the driving transistor DT7 is turned on to provide the driving current Ioled to the light-emitting element EL. The driving current Ioled corresponds to Equation 1. Referring to Equation 1, since the threshold voltage value of the driving transistor is removed from the driving current Ioled, the driving current Ioled does not depend on the threshold voltage of the driving transistor and is not affected even by the change of the threshold voltage.

The first capacitor Cst may constantly provide the driving current Ioled to the light-emitting element EL by maintaining a constant voltage applied to the gate of the driving transistor DT7 during the emission period ④.

An electroluminescent display panel including the pixel driving circuit according to an aspect of the present disclosure will be described as follows.

There is provided an electroluminescent display panel according to an aspect of the present disclosure in which each of a plurality of subpixels included in an nth row (n being a natural number) includes a pixel driving circuit that is driven according to an initialization period, a sampling period, a programming period, and an emission period, wherein the pixel driving circuit comprises a light-emitting element, a first capacitor connected to a first node and a second node, a second capacitor connected to the second node and a high potential voltage line which provides a high potential voltage, a driving transistor configured to supply electric current to the light-emitting element and controlled by a voltage applied to the first node, a first switching circuit controlled by a first scan signal and turned on during the sampling period to compensate for a time-varying characteristic of the driving transistor, a second switching circuit controlled by a second scan signal and turned on during the programming period to apply a data voltage to the second node, and a light emission control circuit controlled by an emission signal and turned on during the initialization period and the emission period to apply the high potential voltage to the driving transistor. In this case, the sampling period is longer as one horizontal period or has a period exceeding the one horizontal period, and the initialization period and the programming period are equal to one horizontal period. Thus, a sampling period can be provided for a high-resolution/high-frequency display panel which is sufficiently long, since usually in common high-resolution/high-frequency display panels the horizontal period is decreased. However, according to the present disclosure the sampling period may be sufficiently secured, and thus it is possible to improve an image quality of the display panel by enhancing compensation capability of a pixel driving circuit.

According to another feature of the present disclosure, the first scan signal and the second scan signal may be output from different scan driving circuits.

According to another feature of the present disclosure, the area of the first capacitor may be twice as large as the area of the second capacitor.

According to another feature of the present disclosure, the first switching circuit may be turned on during the initialization period, a gate of the driving transistor may be discharged with an initialization voltage, and the high potential voltage may be applied to the second node.

According to another feature of the present disclosure, the pixel driving circuit may further include a third switching circuit connected to the high potential voltage line and the second node, and the third switching circuit may be controlled by the second scan signal provided in an (n−4)th row and may be turned on during the initialization period.

According to another feature of the present disclosure, the first switching circuit may include a first transistor connected to the first node and an initialization voltage line, a second transistor connected to the initialization voltage line and a drain of the driving transistor, and a third transistor connected to the second node and a source of the driving transistor. Also, the first transistor may comprise two transistors implemented as a double-gate transistor, and one of the two transistors which is connected to the first node may have a greater channel length than the other transistor which is connected to the initialization voltage line.

According to another feature of the present disclosure, the light emission control circuit may include a first emission transistor connected to the high potential voltage line and a source of the driving transistor and turned on by the emission signal and a second emission transistor connected to a drain of the driving transistor and an anode of the light-emitting element and turned on by the emission signal.

According to another feature of the present disclosure, the sampling period may vary depending on a resolution of the electroluminescent display panel.

There is provided an electroluminescent display panel according to an aspect of the present disclosure in which each of a plurality of subpixels included in an nth row (n being a natural number) includes a pixel driving circuit that is driven according to an initialization period, a sampling period, a programming period, and an emission period, wherein the pixel driving circuit includes a light-emitting element, a first capacitor connected to a first node and a second node, a second capacitor connected to the second node and a high potential voltage line, a driving transistor configured to supply electric current to the light-emitting element and controlled by a voltage applied to the first node, a first switching circuit controlled by a first emission signal and turned on during the sampling period to compensate for a time-varying characteristic of the driving transistor, a second switching circuit controlled by a scan signal and turned on during the programming period to apply a data voltage to the second node, and a light emission control circuit controlled by a second emission signal and turned on during the initialization period and the emission period to apply the high potential voltage to the driving transistor. In this case, the sampling period is longer as one horizontal period or has a period exceeding one horizontal period, and the initialization period and the programming period are equal to the one horizontal period. Thus, a sampling period can be provided for a high-resolution/high-frequency display panel which is sufficiently long, since usually in common high-resolution/high-frequency display panels the horizontal period is decreased. However, according to the present disclosure the sampling period may be sufficiently secured, and thus it is possible to improve an image quality of the display panel by enhancing compensation capability of a pixel driving circuit.

According to another feature of the present disclosure, the area of the first capacitor may be twice as large as the area of the second capacitor.

According to another feature of the present disclosure, the first switching circuit may be an NMOS transistor, and the light emission control circuit may be a PMOS transistor.

According to another feature of the present disclosure, the first emission signal is an emission signal provided in an $(n-1)^{th}$ row. Also, the first switch circuit may be turned on even during the initialization period, the gate of the driving transistor may be discharged with the initialization voltage, and the high potential voltage may be applied to the second node.

According to another feature of the present disclosure, the first emission signal and the second emission signal are the same emission signal provided in an $(n)^{th}$ row. Also, the pixel driving circuit may further include a third switching circuit connected to the high potential voltage line which provides the high potential voltage and the second node. Also, the third switching circuit may be turned on during the initialization period, and the turn-on and turn-off of the third switching circuit may be controlled by a second scan signal provided in an $(n-4)^{th}$ row.

According to another feature of the present disclosure, the first switching circuit may include a first transistor connected to the first node and an initialization voltage line, a second transistor connected to the initialization voltage line and a drain of the driving transistor, and a third transistor connected to the second node and a source of the driving transistor.

According to another feature of the present disclosure, the light emission control circuit may include a first emission transistor connected to the high potential voltage line and a source of the driving transistor and turned on by the emission signal and a second emission transistor connected to a drain of the driving transistor and an anode of the light-emitting element and turned on by the emission signal.

According to aspects of the present disclosure, it is possible to secure the sampling period to be greater than or equal to one horizontal period by implementing the pixel driving circuit such that the data voltage is not used to compensate for the threshold voltage of the driving transistor.

According to aspects of the present disclosure, it is possible to improve compensation performance of the pixel driving circuit by increasing the area of the capacitor which maintains the voltage applied to the gate of the driving transistor.

According to aspects of the present disclosure, it is possible to reduce leakage current by implementing transistors connected to a capacitor which maintains the gate voltage of the driving transistor as a double-gate transistor. Also, it is possible to reduce leakage current by increasing a channel length of one of the two transistors constituting the double-gate transistor, which is more closely connected to the gate of the driving transistor, more than a channel length of the other transistor, which is more closely connected to the initialization voltage line.

According to aspects of the present disclosure, it is possible to prevent the high potential voltage line from being short-circuited with the initialization voltage line and the low potential voltage electrode during the initialization period by including a third switching circuit so that the third switching circuit is turned on by the second scan signal applied to subpixels in rows prior to the nth row to apply the high potential voltage to a node to which the data voltage is to be applied.

Since the content of the present disclosure described in the problems to be solved, the problem-solving means, and effects does not specify essential features of the claims, the scope of the claims is not limited to matters described in the content of the disclosure.

While the aspects of the present disclosure have been described in detail above with reference to the accompanying drawings, the present disclosure is not limited to the aspects, and various changes and modifications may be made without departing from the technical idea of the present disclosure. Accordingly, the aspects disclosed herein are to be considered descriptive and not restrictive of the technical idea of the present disclosure, and the scope of the technical idea of the present disclosure is not limited by the aspects. Therefore, it should be understood that the above aspects are illustrative rather than restrictive in all respects. The scope of the disclosure should be construed by the appended claims, and all technical idea within the scopes of their equivalents should be construed as being included in the scope of the disclosure.

What is claimed is:

1. An electroluminescent display panel in which each of a plurality of subpixels included in an $n^{th}$ row (n being a natural number) comprises a pixel driving circuit that is driven according to an initialization period, a sampling period, a programming period, and an emission period, wherein the pixel driving circuit comprises:
    a light-emitting element;
    a first capacitor connected to a first node and a second node;
    a second capacitor connected to the second node and a high potential voltage line which provides a high potential voltage;
    a driving transistor configured to supply electric current to the light-emitting element and controlled by a voltage applied to the first node;
    a first switching circuit controlled by a first scan signal and turned on during the sampling period to compensate for a time-varying characteristic of the driving transistor;
    a second switching circuit controlled by a second scan signal and turned on during the programming period to apply a data voltage to the second node; and
    a light emission control circuit controlled by an emission signal and turned on during the initialization period and the emission period to apply the high potential voltage to the driving transistor,
    wherein the sampling period is a period exceeding one horizontal period, and the initialization period and the programming period are equal to the one horizontal period.

2. The electroluminescent display panel of claim 1, wherein the first scan signal and the second scan signal are output from different scan driving circuits.

3. The electroluminescent display panel of claim 1, wherein an area of the first capacitor is twice as large as an area of the second capacitor.

4. The electroluminescent display panel of claim 1, wherein the first switching circuit is turned on during the initialization period, a gate of the driving transistor is discharged with an initialization voltage, and the high potential voltage is applied to the second node.

5. The electroluminescent display panel of claim 1, wherein the pixel driving circuit further comprises a third switching circuit connected to the high potential voltage line and the second node; and
    wherein the third switching circuit is controlled by the second scan signal provided in an $(n-4)^{th}$ row and turned on during the initialization period.

6. The electroluminescent display panel of claim 1, wherein the first switching circuit comprises:
    a first transistor connected to the first node and an initialization voltage line;
    a second transistor connected to the initialization voltage line and a drain of the driving transistor; and
    a third transistor connected to the second node and a source of the driving transistor.

7. The electroluminescent display panel of claim 6, wherein the first transistor comprises two transistors implemented as a double-gate transistor; and
    one of the two transistors which is connected to the first node has a greater channel length than the other transistor which is connected to the initialization voltage line.

8. The electroluminescent display panel of claim 1, wherein the light emission control circuit comprises:

a first emission transistor connected to the high potential voltage line and a source of the driving transistor and turned on by the emission signal; and a second emission transistor connected to a drain of the driving transistor and an anode of the light-emitting element and turned on by the emission signal.

9. The electroluminescent display panel of claim 1, wherein the sampling period varies depending on a resolution of the electroluminescent display panel.

10. An electroluminescent display panel in which each of a plurality of subpixels included in an $n^{th}$ row (n being a natural number) comprises a pixel driving circuit that is driven according to an initialization period, a sampling period, a programming period, and an emission period, wherein the pixel driving circuit comprises:

a light-emitting element;

a first capacitor connected to a first node and a second node;

a second capacitor connected to the second node and a high potential voltage line;

a driving transistor configured to supply electric current to the light-emitting element and controlled by a voltage applied to the first node;

a first switching circuit controlled by a first emission signal and turned on during the sampling period to compensate for a time-varying characteristic of the driving transistor;

a second switching circuit controlled by a scan signal and turned on during the programming period to apply a data voltage to the second node; and a light emission control circuit controlled by a second emission signal and turned on during the initialization period and the emission period to apply a high potential voltage to the driving transistor, wherein the sampling period is a period exceeding one horizontal period, and the initialization period and the programming period are equal to the one horizontal period.

11. The electroluminescent display panel of claim 10, wherein an area of the first capacitor is twice as large as an area of the second capacitor.

12. The electroluminescent display panel of claim 10, wherein the first switching circuit is an n-type metal oxide semiconductor (NMOS) transistor, and the light emission control circuit is a p-type metal oxide semiconductor (PMOS) transistor.

13. The electroluminescent display panel of claim 10, wherein the first emission signal is an emission signal provided in an $(n-1)^{th}$ row.

14. The electroluminescent display panel of claim 13, wherein the first switching circuit is turned on even during the initialization period, a gate of the driving transistor is discharged with an initialization voltage, and the high potential voltage is applied to the second node.

15. The electroluminescent display panel of claim 10, wherein the first emission signal and the second emission signal are the same emission signal provided in the $n^{th}$ row.

16. The electroluminescent display panel of claim 15, wherein the pixel driving circuit further comprises a third switching circuit connected to the high potential voltage line, which provides the high potential voltage, and the second node.

17. The electroluminescent display panel of claim 16, wherein the third switching circuit is turned on during the initialization period.

18. The electroluminescent display panel of claim 16, wherein turn-on and turn-off of the third switching circuit is controlled by a second scan signal provided in an $(n-4)^{th}$ row.

19. The electroluminescent display panel of claim 10, wherein the first switching circuit comprises:

a first transistor connected to the first node and an initialization voltage line;

a second transistor connected to the initialization voltage line and a drain of the driving transistor; and a third transistor connected to the second node and a source of the driving transistor.

20. The electroluminescent display panel of claim 10, wherein the light emission control circuit comprises:

a first emission transistor connected to the high potential voltage line and a source of the driving transistor and turned on by the emission signal; and a second emission transistor connected to a drain of the driving transistor and an anode of the light-emitting element and turned on by the emission signal.

* * * * *